(12) United States Patent
Mun et al.

(10) Patent No.: US 12,300,355 B2
(45) Date of Patent: *May 13, 2025

(54) NON-VOLATILE MEMORY DEVICE, CONTROLLER AND MEMORY SYSTEM

(71) Applicant: SAMSUNG ELECTRONICS CO., LTD., Suwon-si (KR)

(72) Inventors: Kuiyon Mun, Busan (KR); Beomkyu Shin, Seongnam-si (KR); Jaeyong Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 44 days.

This patent is subject to a terminal disclaimer.

(21) Appl. No.: 18/235,189

(22) Filed: Aug. 17, 2023

(65) Prior Publication Data

US 2023/0395111 A1 Dec. 7, 2023

Related U.S. Application Data

(63) Continuation of application No. 17/549,095, filed on Dec. 13, 2021, now Pat. No. 11,763,869, which is a
(Continued)

(30) Foreign Application Priority Data

Aug. 7, 2019 (KR) ........................ 10-2019-0096325

(51) Int. Cl.
*G11C 8/18* (2006.01)
*G11C 7/10* (2006.01)
(Continued)

(52) U.S. Cl.
CPC ............... *G11C 8/18* (2013.01); *G11C 7/106* (2013.01); *G11C 7/1066* (2013.01);
(Continued)

(58) Field of Classification Search
CPC .. G11C 8/18; G11C 8/06; G11C 7/222; G11C 7/1087; G11C 7/1093; G11C 7/106;
(Continued)

(56) References Cited

U.S. PATENT DOCUMENTS 7,802,061 B2 9/2010 Qawami et al.
8,102,710 B2 1/2012 Pekny et al.
(Continued)

FOREIGN PATENT DOCUMENTS

CN 102467978 A 5/2012
CN 102760107 A 10/2012
(Continued)

OTHER PUBLICATIONS

Communication dated Aug. 18, 2021, from The China National Intellectual Property Administration in Application No. 202010191358.2.
(Continued)

*Primary Examiner* — Xiaochun L Chen
(74) *Attorney, Agent, or Firm* — Sughrue Mion, PLLC

(57) ABSTRACT

A non-volatile memory device is provided. The non-volatile memory device includes a clock pin, a clock signal being received from a controller through the clock pin; a first input/output pin; a second input/output pin, data being received from the controller in synchronization with the clock signal through the second input/output pin; a command/address buffer configured to operate at a first operating speed and buffer a command and an address received through the first input/output pin in synchronization with the clock signal; a memory cell array including a plurality of memory cells; and a control logic configured to control operations with respect to the plurality of memory cells, based on the command and the address buffered in the command/address buffer.

20 Claims, 20 Drawing Sheets

Related U.S. Application Data continuation of application No. 16/916,345, filed on Jun. 30, 2020, now Pat. No. 11,200,932.

(51) Int. Cl.
 *G11C 7/22* (2006.01)
 *G11C 8/06* (2006.01)
(52) U.S. Cl.
 CPC .......... *G11C 7/1087* (2013.01); *G11C 7/1093* (2013.01); *G11C 7/222* (2013.01); *G11C 8/06* (2013.01)
(58) Field of Classification Search
 CPC ......... G11C 7/1066; G11C 7/22; G11C 16/32; G11C 2207/2281; G11C 2207/229; G11C 7/109; G11C 7/1072; G06F 13/1689
 See application file for complete search history.

(56) References Cited

U.S. PATENT DOCUMENTS

| | | |
|---|---|---|
| 8,286,021 B2 | 10/2012 | Kim et al. |
| 9,159,438 B2 | 10/2015 | Im |
| 9,261,940 B2 | 2/2016 | Kim et al. |
| 9,728,234 B1 | 8/2017 | Kim et al. |
| 10,061,699 B2 | 8/2018 | Brewer et al. |
| 10,366,023 B2 | 7/2019 | Kim et al. |
| 10,558,594 B2 | 2/2020 | Kwon |
| 2005/0135145 A1 | 6/2005 | Lee et al. |
| 2007/0070793 A1 | 3/2007 | Do |
| 2008/0162790 A1 | 7/2008 | Im |
| 2009/0300237 A1 | 12/2009 | Nobunaga et al. |
| 2011/0264851 A1 | 10/2011 | Jeon et al. |
| 2012/0106263 A1 | 5/2012 | Kim |
| 2012/0278539 A1 | 11/2012 | Hosogaya |
| 2015/0003182 A1 | 1/2015 | Maheshwari et al. |
| 2015/0187423 A1 | 7/2015 | Kang |
| 2015/0187428 A1 | 7/2015 | Okada et al. |
| 2016/0269169 A1 | 9/2016 | Choi et al. |
| 2018/0293190 A1 | 10/2018 | Jang |
| 2019/0079882 A1 | 3/2019 | Kim et al. |
| 2019/0205268 A1 | 7/2019 | Hampel et al. |
| 2019/0237112 A1 | 8/2019 | Kil et al. |

FOREIGN PATENT DOCUMENTS

| | | |
|---|---|---|
| CN | 104681072 A | 6/2015 |
| DE | 10 2018 117 119 A1 | 3/2019 |
| KR | 10-0564598 B1 | 3/2006 |
| KR | 10-0851545 B1 | 7/2008 |
| KR | 10-2017-0117776 A | 10/2017 |
| KR | 10-2018-0113371 A | 10/2018 |
| KR | 10-2019-0029056 A | 3/2019 |

OTHER PUBLICATIONS

Communication dated Feb. 4, 2022, issued by the German Patent and Trademark Office in German Patent Application No. 102020108086.7.

Communication dated May 12, 2021 issued by the Korean Intellectual Property Office in counterpart Korean Application No. 10-2019-0096325.

Office Action issued Jan. 13, 2021 by the Korean Intellectual Property Office in corresponding Korean Application No. 10-2019-0096325.

NON-VOLATILE MEMORY DEVICE, CONTROLLER AND MEMORY SYSTEM

CROSS-REFERENCE TO RELATED APPLICATIONS

This application is a continuation application of U.S. patent application Ser. No. 17/549,095, filed on Dec. 13, 2021, now U.S. Pat. No. 11,763,869, which is a continuation application of U.S. patent application Ser. No. 16/916,345, filed on Jun. 30, 2020 in the U.S. Patent and Trademark Office, now U.S. Pat. No. 11,200,932, which claims priority from Korean Patent Application No. 10-2019-0096325, filed on Aug. 7, 2019 in the Korean Intellectual Property Office, the disclosures of which are incorporated herein by reference in their entireties.

BACKGROUND

Methods and apparatuses consistent with embodiments of the present disclosure relate to a memory device, and more particularly, to a non-volatile memory device, a controller, and a memory system including the non-volatile memory device and the controller.

Recently, storage devices, such as solid state drives (SSDs), have been widely used. The storage devices may correspond to, for example, the memory system including the non-volatile memory device such as a flash memory and the controller for controlling the non-volatile memory device. As the performance of storage devices increases, a data input/output speed between the non-volatile memory device and the controller in the storage devices also increases. Accordingly, data may be transmitted and received at high speed between the controller and the non-volatile memory device. On the other hand, commands and addresses may be transmitted from the controller to the non-volatile memory device according to a timing parameter having a predetermined fixed time value. As a result, despite the increase in the data input/output speed, the input/output efficiency may be rather reduced.

SUMMARY

According to an aspect of an example embodiment, there is provided a non-volatile memory device including a clock pin, a clock signal being received from a controller through the clock pin; a first input/output pin; a second input/output pin, data being received from the controller in synchronization with the clock signal through the second input/output pin; a command/address buffer configured to operate at a first operating speed and buffer a command and an address received through the first input/output pin in synchronization with the clock signal; a memory cell array including a plurality of memory cells; and a control logic configured to control operations with respect to the plurality of memory cells, based on the command and the address buffered in the command/address buffer.

According to an aspect of an example embodiment, there is provided a controller including: a clock pin, a first input/output pin and a second input/output pin that are configured to connect to a non-volatile memory device; and at least one processor configured to: transmit a clock signal to the non-volatile memory device through the clock pin; transmit a command and an address in synchronization with the clock signal to the non-volatile memory device through the first input/output pin; and transceive data synchronized with the clock signal with the non-volatile memory device through the second input/output pin.

According to an aspect of an example embodiment, there is provided a memory system including: a non-volatile memory device; and a controller configured to transmit a clock signal, a command, an address and data which are respectively synchronized with the clock signal, to the non-volatile memory device. The non-volatile memory device includes: a clock pin configured to receive the clock signal from the controller; an input/output pin configured to receive the command, the address, and the data synchronized with the clock signal from the controller; a command latch enable pin configured to receive a command latch enable signal from the controller; an address latch enable pin configured to receive an address latch enable signal from the controller; a command/address buffer configured to buffer the command and the address received through the input/output pin in synchronization with the clock signal received through the clock pin, and based on the command latch enable signal and the address latch enable signal; a memory cell array including a plurality of memory cells; and a control logic configured to control operations with respect to the plurality of memory cells, based on the command and the address buffered in the command/address buffer.

BRIEF DESCRIPTION OF THE DRAWINGS

The above and other aspects, features, and advantages of the present disclosure will be more clearly understood from the following detailed description taken in conjunction with the accompanying drawings in which.

DETAILED DESCRIPTION

Figure 1:
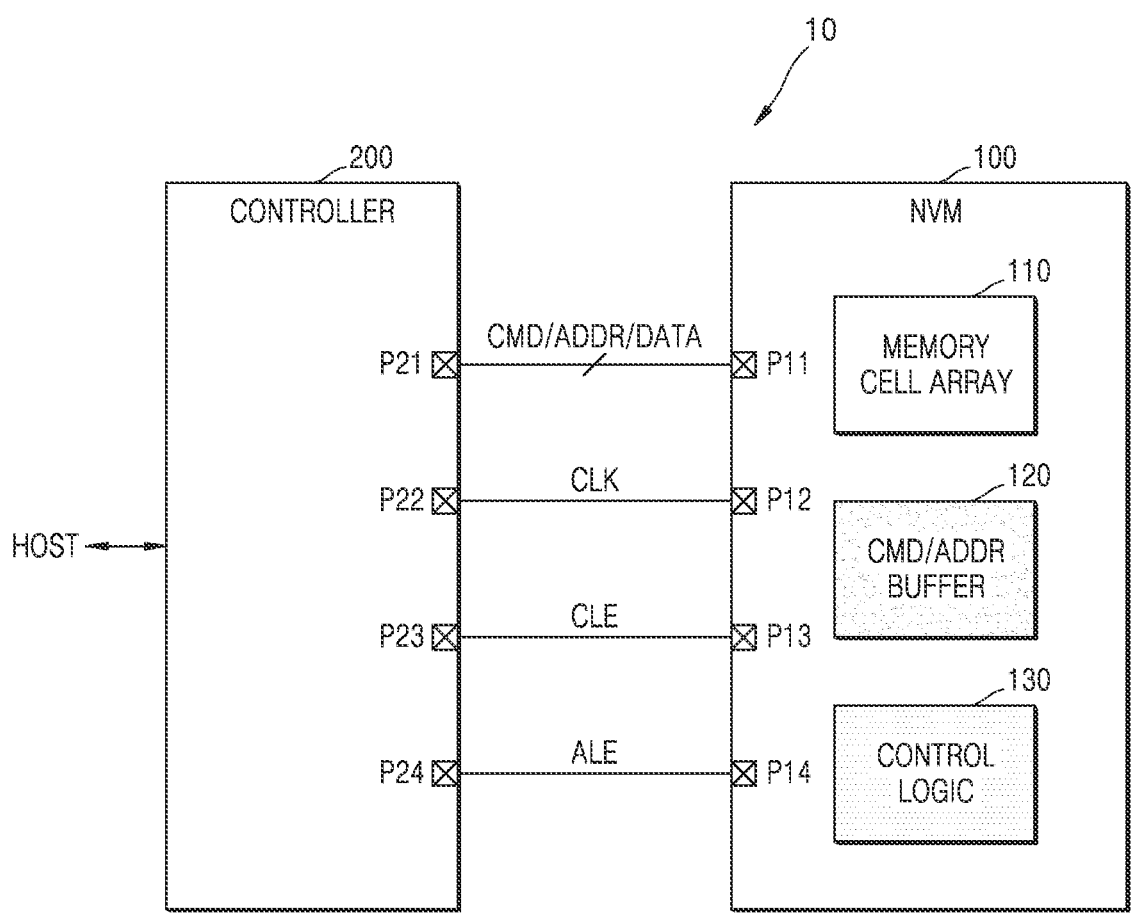
FIG. 1 is a block diagram illustrating a memory system according to an example embodiment.

Hereinafter, example embodiments will be described in detail with reference to the accompanying drawings. The present disclosure may, however, be embodied in many different forms and should not be construed as limited to the embodiments set forth herein. Like reference numerals refer to like elements throughout this application. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a block diagram illustrating a memory system 10 according to an example embodiment.

Referring to FIG. 1, the memory system 10 may include a non-volatile memory device (NVM) 100 and a controller 200. The non-volatile memory device 100 may include a memory cell array 110 including a plurality of memory cells, a command/address buffer 120, and a control logic 130. In addition, the non-volatile memory device 100 may further include first to fourth pins P11 to P14, and the controller 200 may include first to fourth pins P21 to P24. For example, the memory system 10 may be implemented as a storage device such as an SSD.

The controller 200 may control the non-volatile memory device 100 to read data stored in the non-volatile memory device 100 or to program data in the non-volatile memory device 100, based on a read/write request from a host HOST. According to some embodiments, the controller 200 may be referred to as a memory controller. Specifically, the controller 200 may control program, read, and erase operations performed on the non-volatile memory device 100 by providing a command CMD and an address ADDR to the non-volatile memory device 100. In addition, data DATA for programming and read data DATA may be transmitted and received between the controller 200 and the non-volatile memory device 100.

The command CMD and the address ADDR may be transmitted from the controller 200 to the non-volatile memory device 100 by using the same input/output channel as that of the data DATA. For example, the controller 200 may sequentially transmit the command CMD and the address ADDR to the non-volatile memory device 100 through the input/output channel, and then may transmit the data DATA for programming through the input/output channel or may receive the read data DATA from the non-volatile memory device 100.

The controller 200 may transmit the command CMD and the address ADDR to the non-volatile memory device 100 through a first pin P21 and may transmit and receive the data DATA with respect to the non-volatile memory device 100 through the first pin P21. Hereinafter, the first pin P21 will be referred to as an "input/output pin". For example, an input/output pin P21 may be implemented with a plurality of input/output pins, and the plurality of input/output pins may be electrically connected to the non-volatile memory device 100 through a plurality of input/output lines, respectively.

However, example embodiments are not limited thereto, and in some example embodiments, a channel through which the command CMD and the address ADDR are transmitted and a channel through which the data DATA is transmitted and received may be separated from the other. Accordingly, the controller 200 may transmit the command CMD and the address ADDR to the non-volatile memory device 100 through the first input/output pin and may transmit and receive the data DATA with respect to the non-volatile memory device 100 through the second input/output pin. This will be described in detail with reference to FIG. 5. The controller 200 may transmit a clock signal CLK to the non-volatile memory device 100 through the second pin P22. Hereinafter, the second pin P22 will be referred to as a "clock pin". In one embodiment, the clock signal CLK may include a data input/output clock signal (e.g., a data strobe signal), which will be described in detail with reference to FIGS. 5 to 12. In one embodiment, the clock signal CLK may include a write enable signal. In one embodiment, the clock signal CLK may include a read enable signal. In one embodiment, the clock signal CLK may include a plurality of signals and may include, for example, the write enable signal and the read enable signal, which will be described in detail with reference to FIGS. 13 to 17. In one embodiment, the clock signal CLK may be provided as a differential signal. In some embodiments, the clock signal CLK may be toggled only in a period in which the command CMD and the address ADDR are transmitted or only in a section in which the data DATA is transmitted and received.

The controller 200 may synchronize the command CMD, the address ADDR and the data DATA to the clock signal CLK, and the command CMD, the address ADDR and the data DATA synchronized to the clock signal CLK may be transmitted to the non-volatile memory device 100. In one embodiment, the command CMD, the address ADDR and the data DATA may be synchronized to a rising edge of the clock signal CLK. In one embodiment, the command CMD, the address ADDR and the data DATA may be synchronized to a falling edge of the clock signal CLK. In one embodiment, the command CMD, the address ADDR and the data DATA may be synchronized to the rising edge and the falling edge of the clock signal CLK. For example, they may be transmitted to the non-volatile memory device 100 in a double data rate (DDR) mode. Accordingly, as a frequency of the clock signal CLK increases, transmission speeds of the command CMD and the address ADDR as well as the data DATA may be improved.

The controller 200 may transmit a command latch enable signal CLE indicating a transmission time of the command CMD to the non-volatile memory device 100 through the third pin P23. Hereinafter, the third pin P23 will be referred to as a "command latch enable signal pin". In addition, the controller 200 may transmit an address latch enable signal ALE indicating a transmission time of the address ADDR to the non-volatile memory device 100 through the fourth pin P24. Hereinafter, the fourth pin P24 will be referred to as an "address latch enable signal pin". As described above, the controller 200 may distinguish the command CMD, the address ADDR and the data DATA from each other, which are transmitted to the non-volatile memory device 100 through a same channel, by using the command latch enable signal CLE and the address latch enable signal ALE.

The non-volatile memory device 100 may receive the command CMD and the address ADDR from the controller 200 through the first pin P11 and may transmit the data DATA to the controller 200 and/or receive the data DATA from the controller 200 through the first pin P11. Hereinafter, the first pin P11 will be referred to as an "input/output pin". For example, an input/output pin P11 may be implemented with a plurality of input/output pins, and the plurality of input/output pins may be electrically connected to the controller 200 through a plurality of input/output lines, respectively.

The non-volatile memory device 100 may receive the clock signal CLK from the controller 200 through the second pin P12. Hereinafter, the second pin P12 will be referred to as a "clock pin". The non-volatile memory device 100 may receive the command latch enable signal CLE from the controller 200 through the third pin P13. Hereinafter, the third pin P13 will be referred to as a "command latch enable signal pin". In addition, the non-volatile memory device 100 may receive the address latch enable signal ALE from the controller 200 through the fourth pin P14. Hereinafter, the fourth pin P14 will be referred to as an "address latch enable signal pin".

The command/address buffer 120 may buffer the command CMD and the address ADDR received through the input/output pin P11. The non-volatile memory device 100 may determine a signal received through the input/output pin P11 in an enable period of the command latch enable signal CLE as the command CMD, and the command/address buffer 120 may buffer the command CMD. In addition, the non-volatile memory device 100 may determine a signal received through the input/output pin P11 in an enable period of the address latch enable signal ALE as the address ADDR, and the command/address buffer 120 may buffer the address ADDR.

In one embodiment, the command/address buffer 120 may operate at a first operating speed. For example, the first operating speed may correspond to a data input/output speed between the non-volatile memory device 100 and the controller 200. Accordingly, the command/address buffer 120 may receive the command CMD and the address ADDR synchronized to the clock signal CLK at the data input/output speed and may buffer the received command CMD and the address ADDR.

The control logic 130 may receive the command CMD and the address ADDR buffered in the command/address buffer 120, and may control operations for the plurality of memory cells included in the memory cell array 110 based on the received command CMD and address ADDR. In this embodiment, the control logic 130 may operate at a second operating speed that is different from the first operating speed. In one embodiment, the control logic 130 may operate at the second operating speed lower than the first operating speed. For example, the second operating speed may correspond to an internal operating speed of the non-volatile memory device 100. In addition, the control logic 130 may receive the data from and/or transmit data to the controller 200 through the second input/output pin in synchronization with the clock signal, e.g., a data strobe signal, a write enable signal or a read enable signal and the like.

In some embodiments, the memory system 10 may be an internal memory embedded in an electronic device. For example, the memory system 10 may include an SSD, an embedded universal flash storage (UFS) memory device, or an embedded multi-media card (eMMC). In some embodiments, the memory system 10 may include an external memory detachable from an electronic device. For example, the memory system 10 may include a UFS memory card, a compact flash (CF) card, a secure digital (SD) card, a micro secure digital (Micro-SD) card, a mini secure digital (Mini-SD) card, an extreme digital (xD) card, or a memory stick.

The memory system 10 and the host may constitute a storage system, which may be implemented, for example, in a personal computer (PC), in a data server, in a network-coupled storage, in an internet of things (IoT) device, or in a portable electronic device. The portable electronic device may include a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, and the like.

Figure 2:
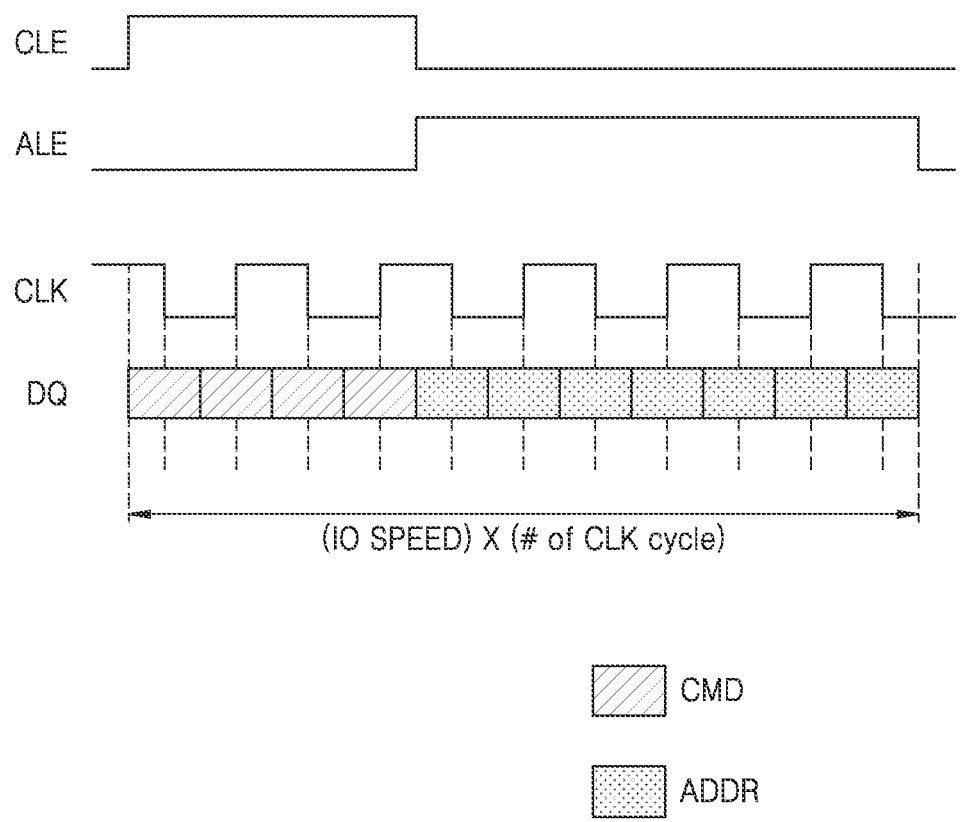
FIG. 2 is a timing diagram illustrating an example of signals transmitted from a controller to a non-volatile memory device of FIG. 1 according to an example embodiment.

FIG. 2 is a timing diagram illustrating an example of signals transmitted from the controller 200 to the non-volatile memory device 100 of FIG. 1 according to an example embodiment.

Referring to FIG. 2, the clock signal CLK may be toggled at a first frequency. In one embodiment, the first frequency may correspond to the data input/output speed between the controller 200 and the non-volatile memory device 100. The command latch enable signal CLE may be enabled with logic "high" in a transmission period of the command CMD. The command CMD may be transmitted to the non-volatile memory device 100 in synchronization with the clock signal CLK. The address latch enable signal ALE may be enabled with logic "high" in a transmission period of the address ADDR. The address ADDR may be transmitted to the non-volatile memory device 100 in synchronization with the clock signal CLK. For example, the command CMD and the address ADDR may be synchronized to the rising edge and the falling edge of the clock signal CLK. Transmission times of the command CMD and the address ADDR to be transmitted through a data signal line DQ may correspond to the product of the input/output speed and the number of cycles of the clock signal CLK.

Figure 3:
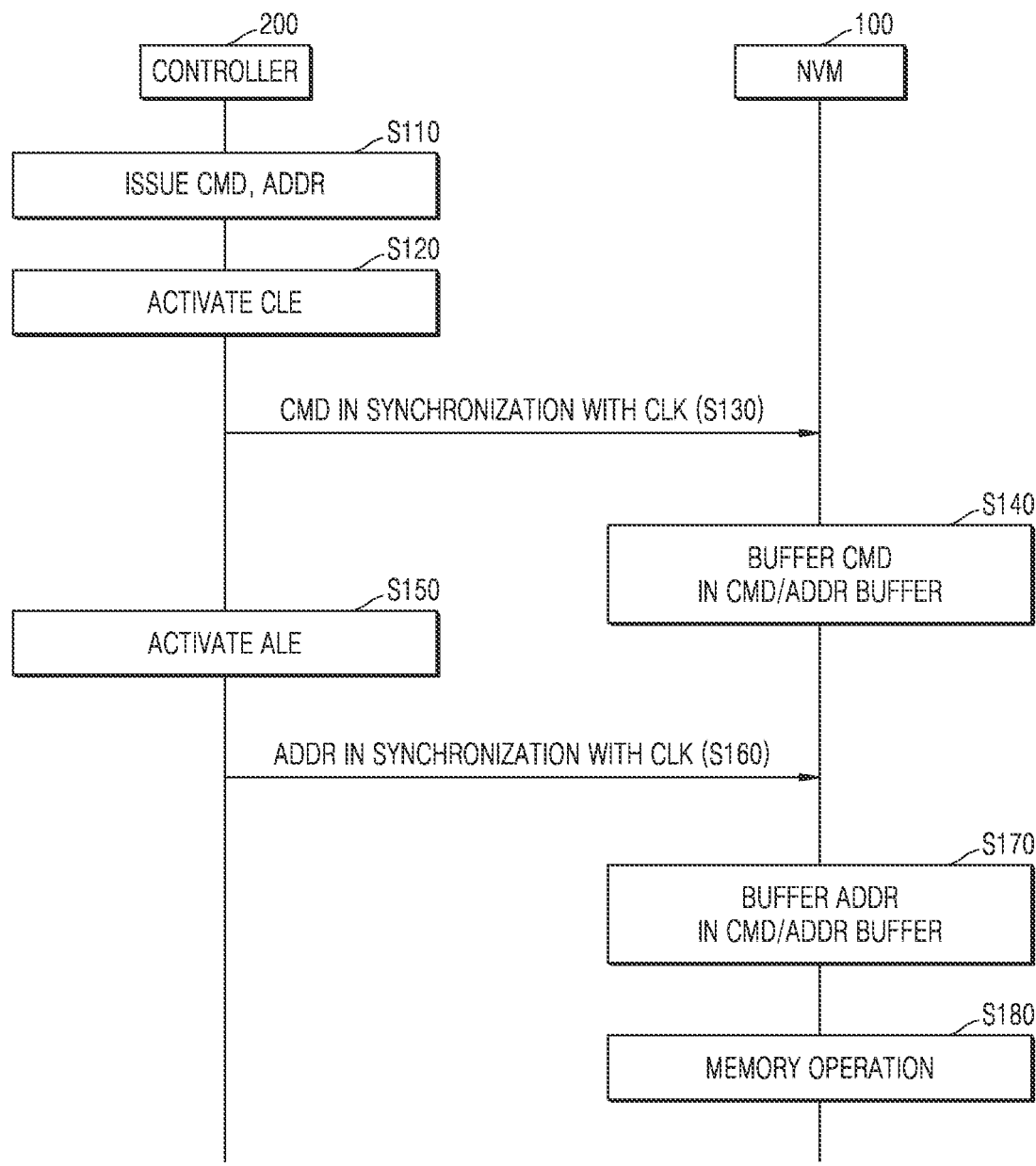
FIG. 3 is a flowchart illustrating an operation between the controller and the non-volatile memory device of FIG. 1 according to an example embodiment.

FIG. 3 is a flowchart illustrating an operation between the controller 200 and the non-volatile memory device 100 of FIG. 1 according to an example embodiment.

Referring to FIGS. 1 to 3 together, in step S110, the controller 200 may issue the command CMD and the address ADDR. In one embodiment, the controller 200 may include a command/address buffer, and the controller 200 may buffer the command CMD and the address ADDR in the command/address buffer. For example, the command CMD may include a write command, a read command, an erase command, or the like.

In step S120, the controller 200 may activate the command latch enable signal CLE. For example, the controller 200 may activate the command latch enable signal CLE from logic "low" to logic "high". In one embodiment, the activation starting time of the command latch enable signal CLE may be substantially the same as the transmission starting time of the command CMD. However, example embodiments are not limited thereto, and in some example embodiments, the activation starting time of the command latch enable signal CLE may be earlier than the transmission starting time of the command CMD.

In step S130, the controller 200 may transmit the command CMD to the non-volatile memory device 100 in synchronization with the clock signal CLK. For example, the controller 200 may output the command CMD through the input/output pin P21, may output the clock signal CLK that toggles through the clock pin P22, and may output the command CMD in synchronization with the clock signal CLK. For example, the non-volatile memory device 100 may receive the command CMD through the input/output pin P11, may receive the clock signal CLK that toggles through the clock pin P12, and may receive the command CMD in synchronization with the clock signal CLK. At this time, the controller 200 may also transmit the activated command latch enable signal CLE to the non-volatile memory device 100. For example, the transmission time of the command CMD may correspond to two cycle periods of the clock signal CLK.

In step S140, the non-volatile memory device 100 may buffer the command CMD in the command/address buffer 120. The command/address buffer 120 may operate at the data input/output speed, and therefore the command/address buffer 120 may directly buffer the command CMD synchronized with the clock signal CLK according to the data input/output speed. At this time, the non-volatile memory device 100 may determine a signal received from the controller 200 through the input/output pin P11 as the command CMD, based on the activated command latch enable signal CLE.

In step S150, the controller 200 may activate the address latch enable signal ALE. For example, the controller 200 may activate the address latch enable signal ALE from logic "low" to logic "high". In one embodiment, the activation starting time of the command latch enable signal CLE may be substantially the same as the transmission starting time of the address ADDR. However, example embodiments are not limited thereto, and in some example embodiments, the activation starting time of the address latch enable signal ALE may be earlier than the transmission starting time of the address ADDR. At this time, the controller 200 may deactivate the command latch enable signal CLE.

In step S160, the controller 200 may transmit the address ADDR to the non-volatile memory device 100 in synchronization with the clock signal CLK. For example, the controller 200 may output the address ADDR through the input/output pin P21, may output the clock signal CLK that toggles through the clock pin P22, and may output the address ADDR in synchronization with the clock signal CLK. For example, the non-volatile memory device 100 may receive the address ADDR through the input/output pin P11, may receive the clock signal CLK that toggles through the clock pin P12, and may receive the address ADDR in synchronization with the clock signal CLK. At this time, the controller 200 may also transmit the activated address latch enable signal ALE to the non-volatile memory device 100. For example, the transmission time of the address ADDR may correspond to three cycle periods of the clock signal CLK.

In step S170, the non-volatile memory device 100 may buffer the address ADDR in the command/address buffer 120. The command/address buffer 120 may operate at the data input/output speed, and therefore the command/address buffer 120 may directly buffer the address ADDR synchronized with the clock signal CLK according to the data input/output speed. At this time, the non-volatile memory device 100 may determine a signal received from the controller 200 through the input/output pin P11 as the address ADDR, based on the address latch enable signal ALE. In step S180, the non-volatile memory device 100 may perform a memory operation based on the command CMD and the address ADDR. For example, the memory operation may include the write operation, the read operation, the erase operation, or the like.

Figure 4:
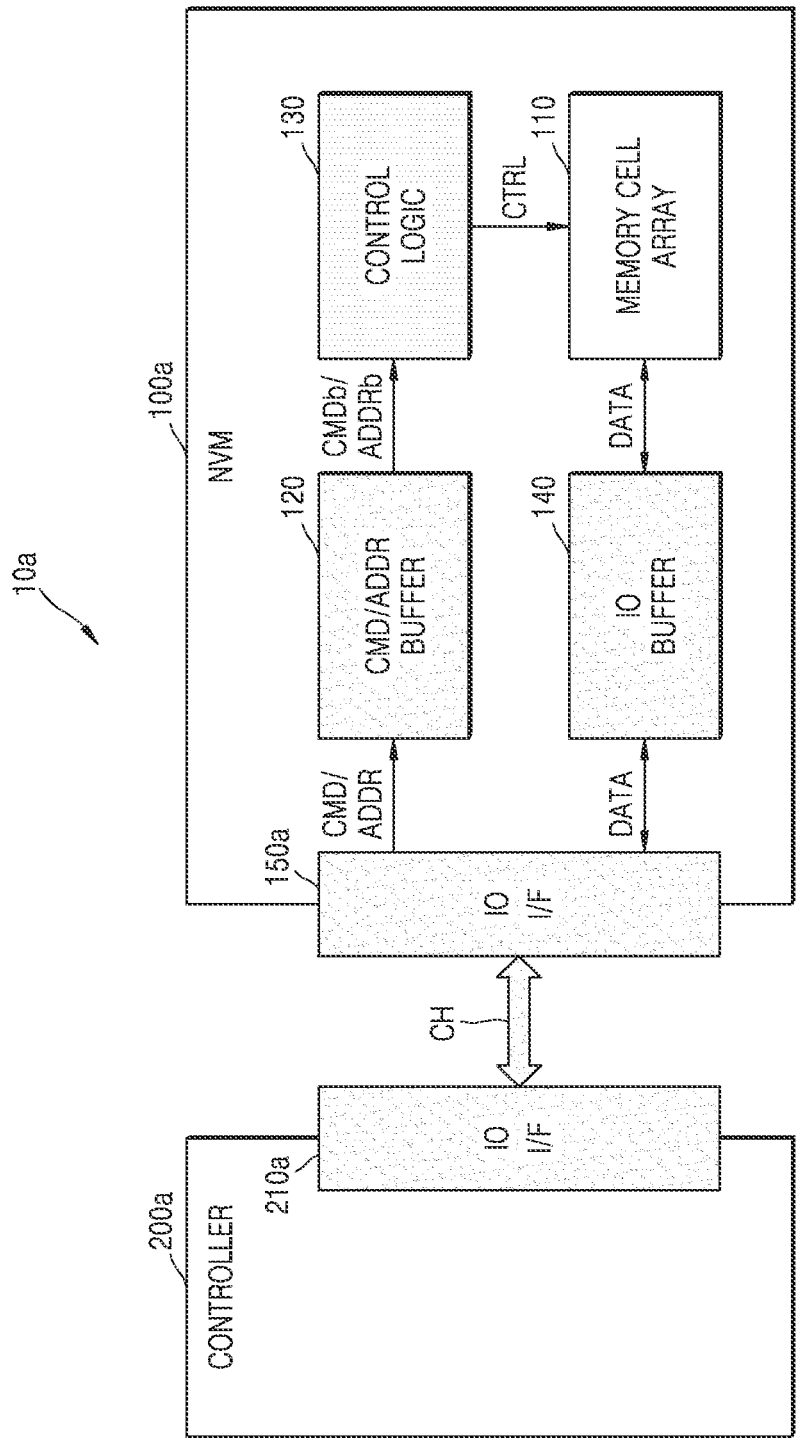
FIG. 4 is a block diagram illustrating a memory system according to an example embodiment.

FIG. 4 is a block diagram illustrating a memory system 10a according to an example embodiment.

Referring to FIG. 4, the memory system 10a may include a non-volatile memory device 100a and a controller 200a. The memory system 10a may correspond to an example of the memory system 10 of FIG. 1, and the non-volatile memory device 100a may correspond to an example of the non-volatile memory device 100 of FIG. 1, and the controller 200a may correspond to an example of the controller 200 of FIG. 1. The descriptions given above with reference to FIGS. 1 to 3 may also be applied to the present embodiment, and redundant descriptions thereof will be omitted.

The non-volatile memory device 100a may include the memory cell array 110, the command/address buffer 120, the control logic 130, an input/output buffer 140, and further include an input-output interface (IO I/F) 150a. The command/address buffer 120 and the input/output buffer 140 may operate at a first operating speed, and the first operating speed may correspond to a data input/output speed between the non-volatile memory device 100a and the controller 200a, that is to say, the data input/output speed through the input/output interface 150a. The control logic 130 may operate at a second operating speed that is different from the first operating speed, for example, at the second operating speed less than the first operating speed, in which the second operating speed may correspond to an internal operating speed of the non-volatile memory device 100a.

The controller 200a may include an input/output interface 210a. The input/output interface 210a and the input/output interface 150a may be electrically connected to each other through an input/output channel CH. The command CMD and the address ADDR may be transmitted from the controller 200a to the non-volatile memory device 100a through the input/output channel CH according to the data input/output speed. The command CMD and the address ADDR received through the input/output interface 150a may be buffered in the command/address buffer 120 according to the data input/output speed.

The data DATA may be transmitted and received between the controller 200a and the non-volatile memory device 100a through the input/output channel CH according to the data input/output speed. The data DATA received through the input/output interface 150a may be buffered in the input/output buffer 140 according to the data input/output speed, and the data DATA buffered in the input/output buffer 140 may be transmitted to the controller 200a through the input/output interface 150a according to the data input/output speed.

The control logic 130 may receive a command CMDb buffered in the command/address buffer 120 and an address ADDRb buffered in the command/address buffer 120, and may generate a control signal CTRL from the buffered command CMDb and the buffered address ADDRb according to the internal operating speed of the non-volatile memory device 100a. The control logic 130 may control memory operations performed on the plurality of memory cells included in the memory cell array 110 according to the control signal CTRL.

For example, the memory operation may include the read operation, and the data DATA read from the memory cell array 110 may be buffered in the input/output buffer 140. The input/output buffer 140 may transmit the buffered data DATA to the controller 200a through the input/output interface 150a according to the data input/output speed. For example, the memory operation may include the write operation, and the input/output buffer 140 may receive the data DATA to be written to the memory cell array 110 from the controller 200a through the input/output interface 150a according to the data input/output speed. The data DATA buffered in the input/output buffer 140 may be written in the memory cells included in the memory cell array 110 according to the internal operating speed.

Figure 5:
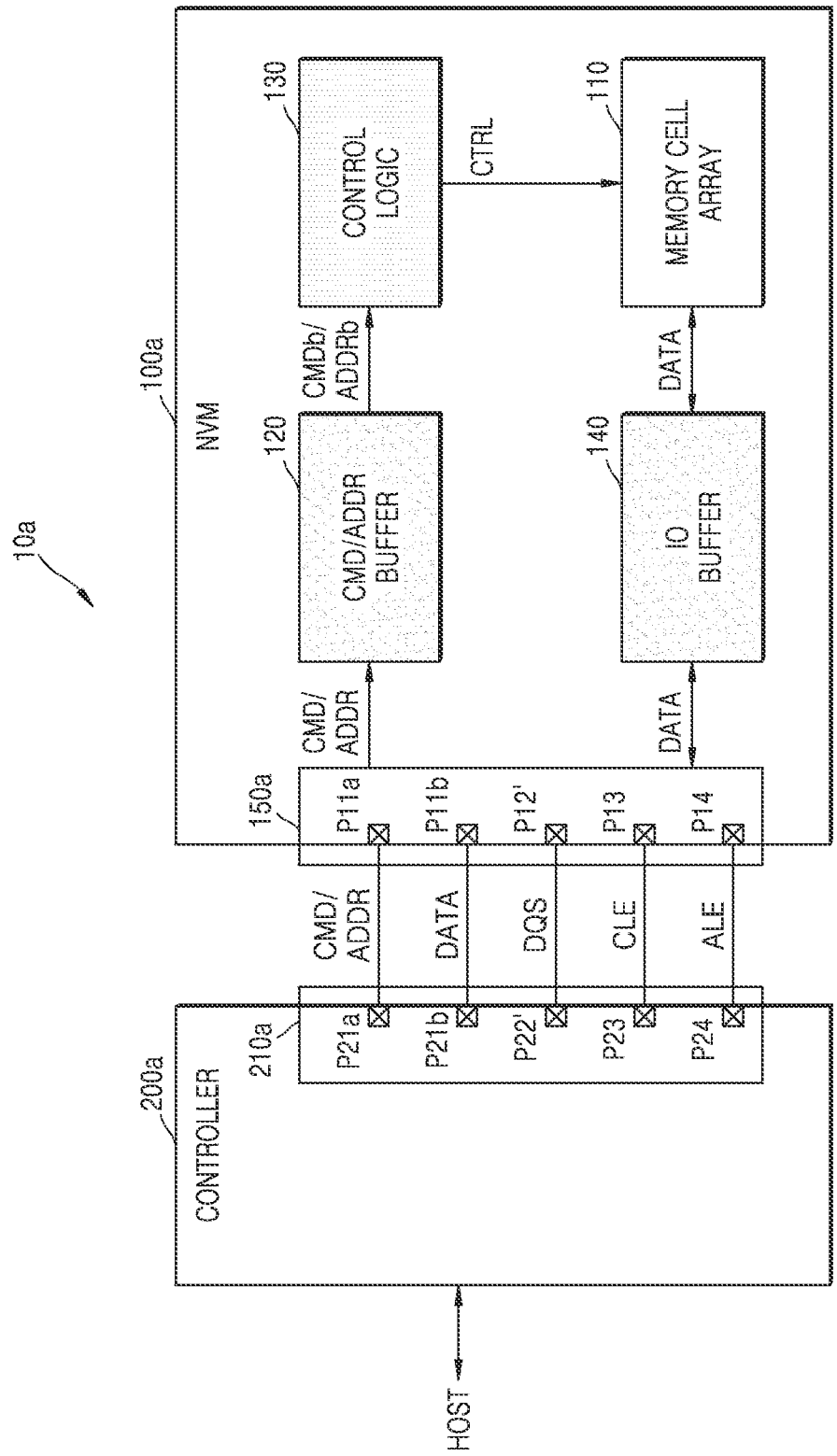
FIG. 5 is a block diagram illustrating the memory system of FIG. 4 in more detail, according to an example embodiment.

FIG. 5 is a block diagram illustrating the memory system 10a of FIG. 4 in more detail, according to an example embodiment.

Referring to FIG. 5, the controller 200a may include the input/output interface 210a, and the input/output interface 210a may include a first input/output pin P21a, a second input/output pin P21b, a data strobe signal pin P22', the command latch enable signal pin P23, and the address latch enable signal pin P24. The controller 200a may transmit the command CMD and the address ADDR to the non-volatile memory device 100a through the first input/output pin P21a and may transmit the data DATA to the non-volatile memory device 100a through the second input/output pin P21b. Accordingly, in some embodiments, the controller 200a may transmit the command CMD and the address ADDR to the non-volatile memory device 100a while transmitting the data DATA.

The data strobe signal pin P22' may correspond to an example of the clock pin P22 of FIG. 1. In one embodiment, the data strobe signal DQS may be transmitted from the data strobe signal pin P22' to a data strobe signal pin P12' and may toggle at a second frequency corresponding to the data input/output speed. In some embodiments, the data strobe signal DQS may toggle only in the transmission periods of the command CMD and the address ADDR or in a transmission/reception period of the data DATA.

The non-volatile memory device 100a may include an input/output interface 150a, and the input/output interface 150a may include a first input/output pin P11a, a second input/output pin P11b, a data strobe signal pin P12', the command latch enable signal pin P13, and the address latch enable signal pin P14. The data strobe signal pin P12' may correspond to an example of the clock pin P12 of FIG. 1.

The non-volatile memory device 100a may receive the command CMD and the address ADDR from the controller 200a through a first input/output pin P11a and may receive the data DATA from the controller 200a through a second input/output pin P11b. Accordingly, in some embodiments, the non-volatile memory device 100a may receive the command CMD and the address ADDR from the controller 200a while receiving the data DATA.

In some embodiments, the first input/output pin P11a and the second input/output pin P11b may be identical to each other, that is to say, may be implemented with the same pin. In addition, the first input/output pin P21a and the second input/output pin P21b may be identical to each other, that is to say, may be implemented with the same pin. Hereinafter, an embodiment in which the first input/output pin and the second input/output pin are implemented with the same pin will be mainly described. However, it is only an example embodiment, and the present disclosure is not limited thereto.

Figure 6:
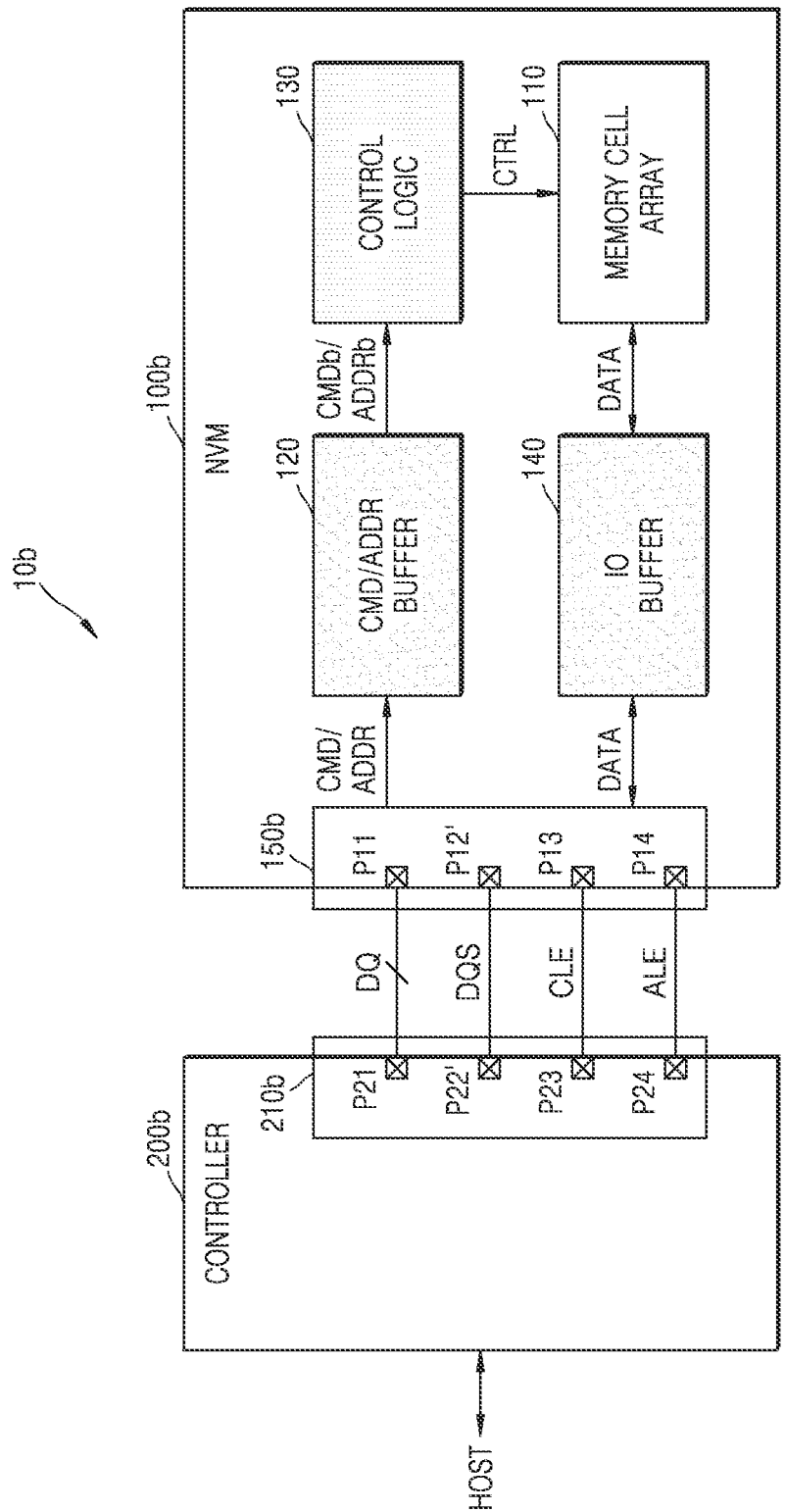
FIG. 6 is a block diagram illustrating a memory system according to an example embodiment.

FIG. 6 is a block diagram illustrating a memory system 10b according to an example embodiment.

Referring to FIG. 6, the memory system 10b may include a non-volatile memory device 100b and a controller 200b. The memory system 10b may correspond to one implementation embodiment of the memory system 10a of FIG. 4, the non-volatile memory device 100b may correspond to one implementation embodiment of the non-volatile memory device 100a of FIG. 4, and the controller 200b may correspond to one implementation embodiment of the controller 200a of FIG. 4. Accordingly, the descriptions given above with reference to FIGS. 1 to 4 may correspond to the memory system 10b.

The controller 200b may include an input/output interface 210b, and the input/output interface 210b may include the input/output pin P21, the data strobe signal pin P22', the command latch enable signal pin P23, and the address latch enable signal pin P24. The data strobe signal pin P22' may correspond to an example of the clock pin P22 of FIG. 1. The non-volatile memory device 100b may include an input/output interface 150b, and the input/output interface 150b may include the input/output pin P11, the data strobe signal pin P12', the command latch enable signal pin P13, and the address latch enable signal pin P14. The data strobe signal pin P12' may correspond to an example of the clock pin P12 of FIG. 1.

Figure 7:
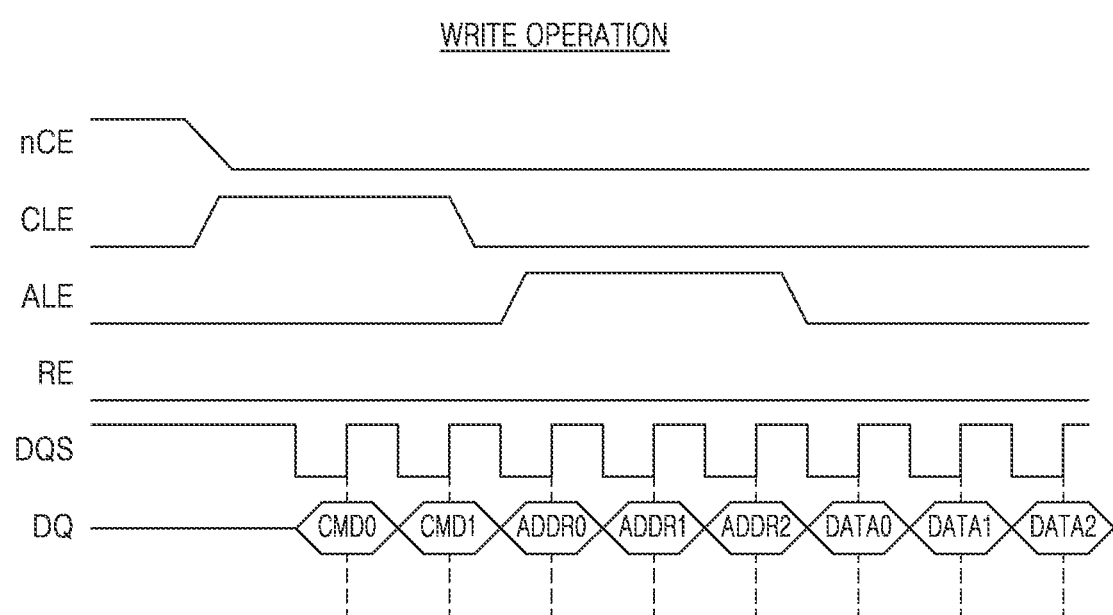
FIG. 7 is a timing diagram illustrating an example of signals in a write operation to the non-volatile memory device of FIG. 6 according to an example embodiment.

FIG. 7 is a timing diagram illustrating an example of signals in a write operation on the non-volatile memory device 100b of FIG. 6 according to an example embodiment.

Referring to FIGS. 6 and 7 together, a chip enable signal nCE may be enabled during the write operation on the non-volatile memory device 100b. A command latch enable signal CLE may be transmitted from the command latch enable signal pin P23 to the command latch enable signal pin P13 and may be enabled in the transmission periods of commands CMD0 and CMD1. The address latch enable signal ALE may be transmitted from the address latch enable signal pin P24 to the address latch enable signal pin P14 and may be enabled in the transmission periods of the addresses ADDR0 to ADDR2. The read enable signal RE may be disabled in the write operation.

The data strobe signal DQS may be transmitted from the data strobe signal pin P22' to a data strobe signal pin P12' and may be toggled at a second frequency corresponding to the data input/output speed. The data signal line DQ may be connected between the input/output pin P21 and the input/output pin P11, and the commands CMD0 and CMD1, the addresses ADDR0 to ADDR2 and the data DATA0 to DATA2 may be transmitted and received through the data signal line DQ in synchronization with the data strobe signal DQS.

The commands CMD0 and CMD1 may be sequentially transmitted from the input/output pin P21 to the input/output pin P11 in synchronization with the data strobe signal DQS. For example, the commands CMD0 and CMD1 may be synchronized to a rising edge of the data strobe signal DQS, and the commands CMD0 and CMD1 may correspond to a write command.

Subsequently, the addresses ADDR0 to ADDR2 may be sequentially transmitted from the input/output pin P21 to the input/output pin P11 in synchronization with the data strobe signal DQS. For example, the addresses ADDR0 to ADDR2 may be synchronized to the rising edge of the data strobe signal DQS, and the addresses ADDR0 to ADDR2 may correspond to a write address.

Subsequently, the data DATA0 to DATA2 may be sequentially transmitted from the input/output pin P21 to the input/output pin P11 in synchronization with the data strobe signal DQS. For example, the data DATA0 to DATA2 may be synchronized to the rising edge of the data strobe signal DQS, and the data DATA0 to DATA2 may correspond to data to be written to the memory cell array 110.

Figure 8:
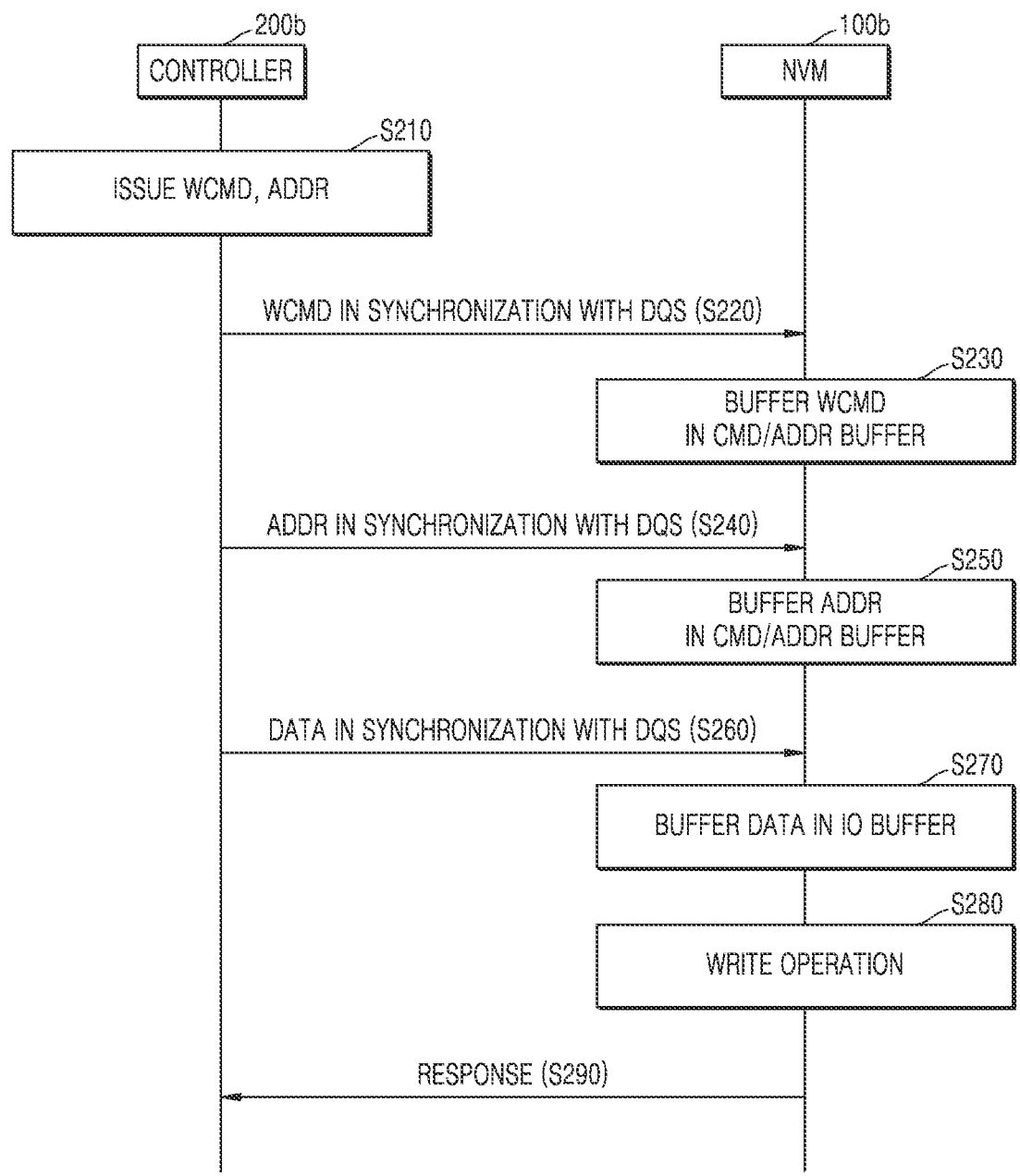
FIG. 8 is a flowchart illustrating the write operation between the controller and the non-volatile memory device of FIG. 6 according to an example embodiment.

FIG. 8 is a flowchart illustrating a write operation between the controller 200b and the non-volatile memory device 100b of FIG. 6 according to an example embodiment.

Referring to FIGS. 6 to 8 together, the write operation according to the present embodiment may correspond to an implementation example of the operation illustrated in FIG. 3, and a redundant description will be omitted. In step S210, the controller 200b may issue a write command WCMD and an address ADDR. In step S220, the controller 200b may transmit the write command WCMD to the non-volatile memory device 100b in synchronization with the data strobe signal DQS. For example, the controller 200b may output the write command WCMD through the input/output pin P21 and output the data strobe signal DQS that toggles through the data strobe signal pin P22', and the command CMD may be output in synchronization with the data strobe signal DQS. For example, the non-volatile memory device 100b may receive the write command WCMD through the input/output pin P11, may receive the data strobe signal DQS that toggles through the data strobe signal pin P12', and may receive the command CMD in synchronization with the data strobe signal DQS. At this time, the controller 200b may also transmit the activated command latch enable signal CLE to the non-volatile memory device 100b. In step S230, the non-volatile memory device 100b may buffer the write command WCMD in the command/address buffer 120.

In step S240, the controller 200b may transmit the address ADDR to the non-volatile memory device 100b in synchronization with the data strobe signal DQS. For example, the controller 200b may output the address ADDR through the input/output pin P21 and may output the data strobe signal DQS that toggles through the data strobe signal pin P22', and may output the address ADDR in synchronization with the data strobe signal DQS. For example, the non-volatile memory device 100b may receive the address ADDR through the input/output pin P11, may receive the data strobe signal DQS that toggles through a data strobe signal pin P12', and may receive the address ADDR in synchronization with the data strobe signal DQS. At this time, the controller 200b may also transmit the activated address latch enable signal ALE to the non-volatile memory device 100b. In step S250, the non-volatile memory device 100b may buffer the address ADDR in the command/address buffer 120.

In step S260, the controller 200b may transmit the data DATA to the non-volatile memory device 100b in synchronization with the data strobe signal DQS. In step S270, the non-volatile memory device 100b may buffer the data DATA in the input/output buffer 140. In step S280, the non-volatile memory device 100b may perform the write operation. Specifically, the non-volatile memory device 100b may write the buffered data DATA in the memory cell array 110. In step S290, the non-volatile memory device 100b may transmit a response message indicating that the write operation is completed, to the controller 200b.

Figure 9:
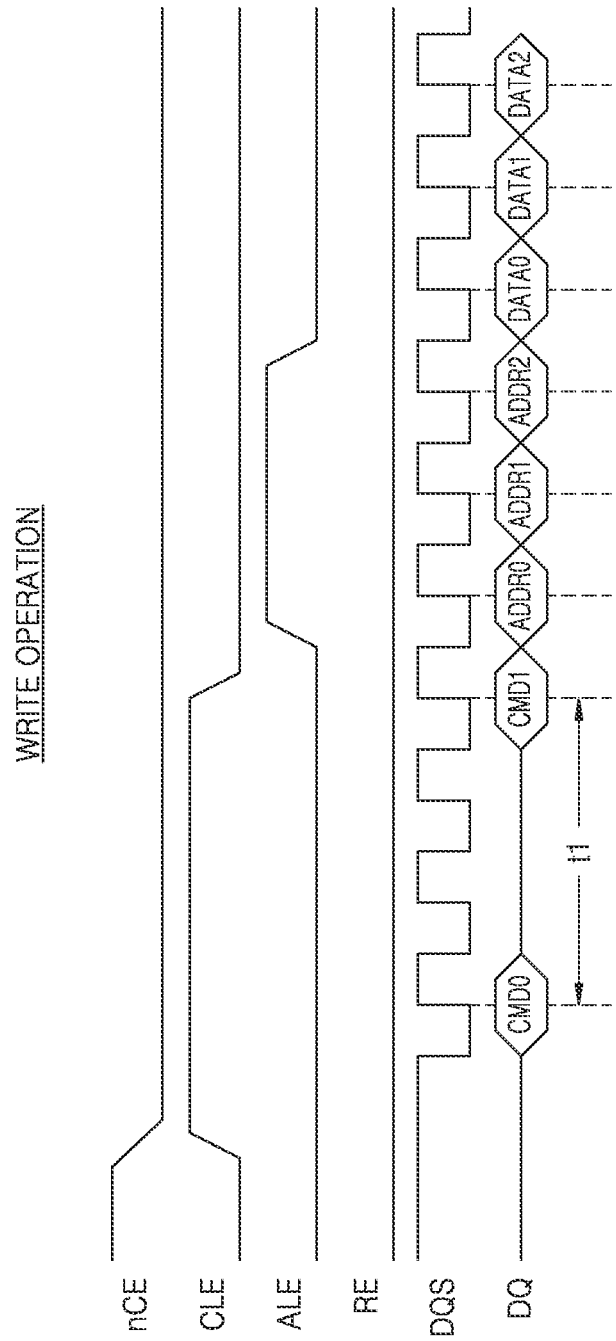
FIG. 9 is a timing diagram illustrating another example of signals in the write operation to the non-volatile memory device of FIG. 6 according to an example embodiment.

FIG. 9 is a timing diagram illustrating another example of signals in a write operation on the non-volatile memory device 100b of FIG. 6 according to an example embodiment.

Referring to FIG. 9, the write operation according to the present embodiment may correspond to a modification of the write operation illustrated in FIG. 7. According to the present embodiment, timing parameters related to the command and the address in the write operation may be determined as a multiple of the number of clock cycles of the data strobe signal DQS. For example, as illustrated in FIG. 9, there are three clock cycles between command CMD0 and command CMD1. In this regard, a timing parameter t1 between the command CMD0 and the command CMD1 may be determined as a value corresponding to three clock cycles of the data strobe signal DQS. Accordingly, as a toggling frequency of the data strobe signal DQS increases, transmission times of the commands CMD0 and CMD1 may decrease, and thus the input/output efficiency may be improved or maintained.

For example, the timing parameter t1 may correspond to tVDLY indicating a delay until a next command is issued after a new volume is selected by using a volume selection command. In the related art, tVDLY has been a fixed time value. Accordingly, although the data input/output speed between the controller 200b and the non-volatile memory device 100b is improved, the input/output efficiency has decreased due to the fixed time value of tVDLY. However, according to example embodiments, tVDLY may be determined as a multiple of the number of clock cycles of the data strobe signal DQS. Accordingly, as the data input/output speed between the controller 200b and the non-volatile memory device 100b is improved, tVDLY may be decreased. Therefore, the transmission times of the command and the address may be decreased according to the improvement of the data input/output speed, so that the input/output efficiency may be improved or maintained.

Figure 10:
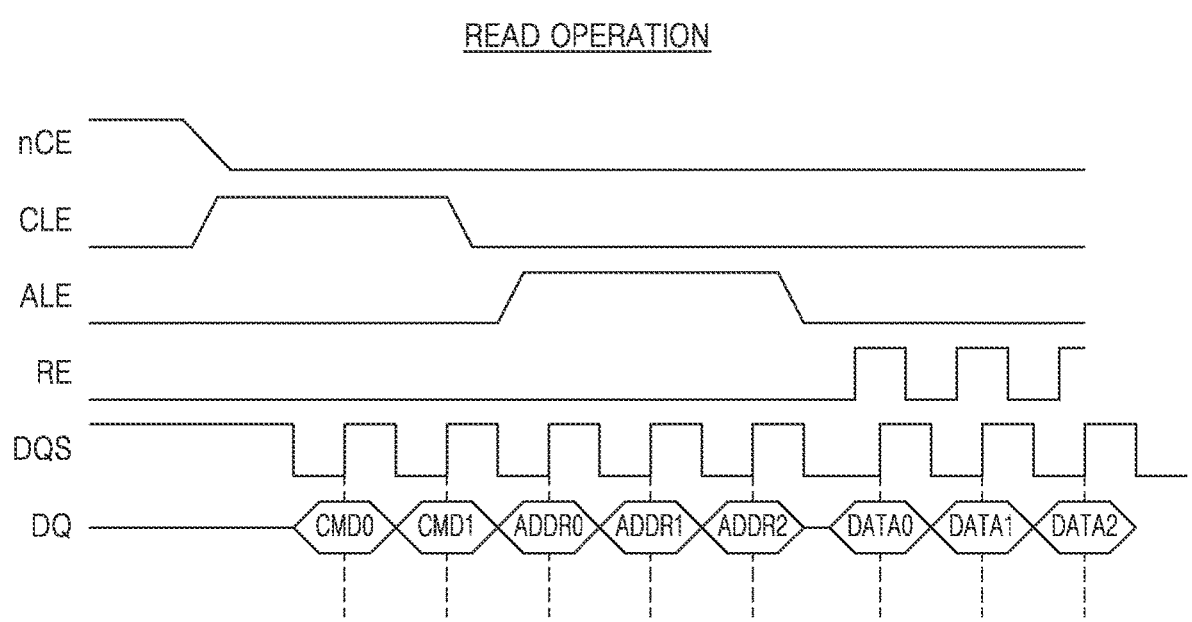
FIG. 10 is a timing diagram illustrating an example of signals in a read operation to the non-volatile memory device of FIG. 6 according to an example embodiment.

FIG. 10 is a timing diagram illustrating an example of signals in a read operation on the non-volatile memory device 100b of FIG. 6 according to an example embodiment.

Referring to FIGS. 6 and 10 together, the chip enable signal nCE may be enabled during the read operation on the non-volatile memory device 100b. The command latch enable signal CLE may be enabled in the transmission periods of the commands CMD0 and CMD1. The address latch enable signal ALE may be enabled in the transmission periods of the addresses ADDR0 to ADDR2. The read enable signal RE may be toggled at a third frequency in a period in which data DATA0 to DATA2 are transmitted through the data signal line DQ.

The data strobe signal DQS may be toggled at a second frequency corresponding to the data input/output speed. The commands CMD0 and CMD1 may be sequentially transmitted in synchronization with the data strobe signal DQS. For example, the commands CMD0 and CMD1 may be synchronized to the rising edge of the data strobe signal DQS, and the commands CMD0 and CMD1 may correspond to a read command. The addresses ADDR0 to ADDR2 may be sequentially transmitted in synchronization with the data strobe signal DQS. For example, the addresses ADDR0 to ADDR2 may be synchronized to the rising edge of the data strobe signal DQS, and the addresses ADDR0 to ADDR2 may correspond to a read address.

The data DATA0 to DATA2 may be sequentially transmitted from the input/output pin P11 to the input/output pin P21 in synchronization with the data strobe signal DQS. For example, the data DATA0 to DATA2 may be synchronized to the rising edge of the data strobe signal DQS, and the data DATA0 to DATA2 may correspond to data read from the memory cell array 110. Specifically, the read enable signal RE may be toggled first, and then the data strobe signal DQS may be toggled. Based on the read enable signal RE, the non-volatile memory device 100b may synchronize the data DATA0 to DATA2 to the data strobe signal DQS and transmit the same to the controller 200b.

Figure 11:
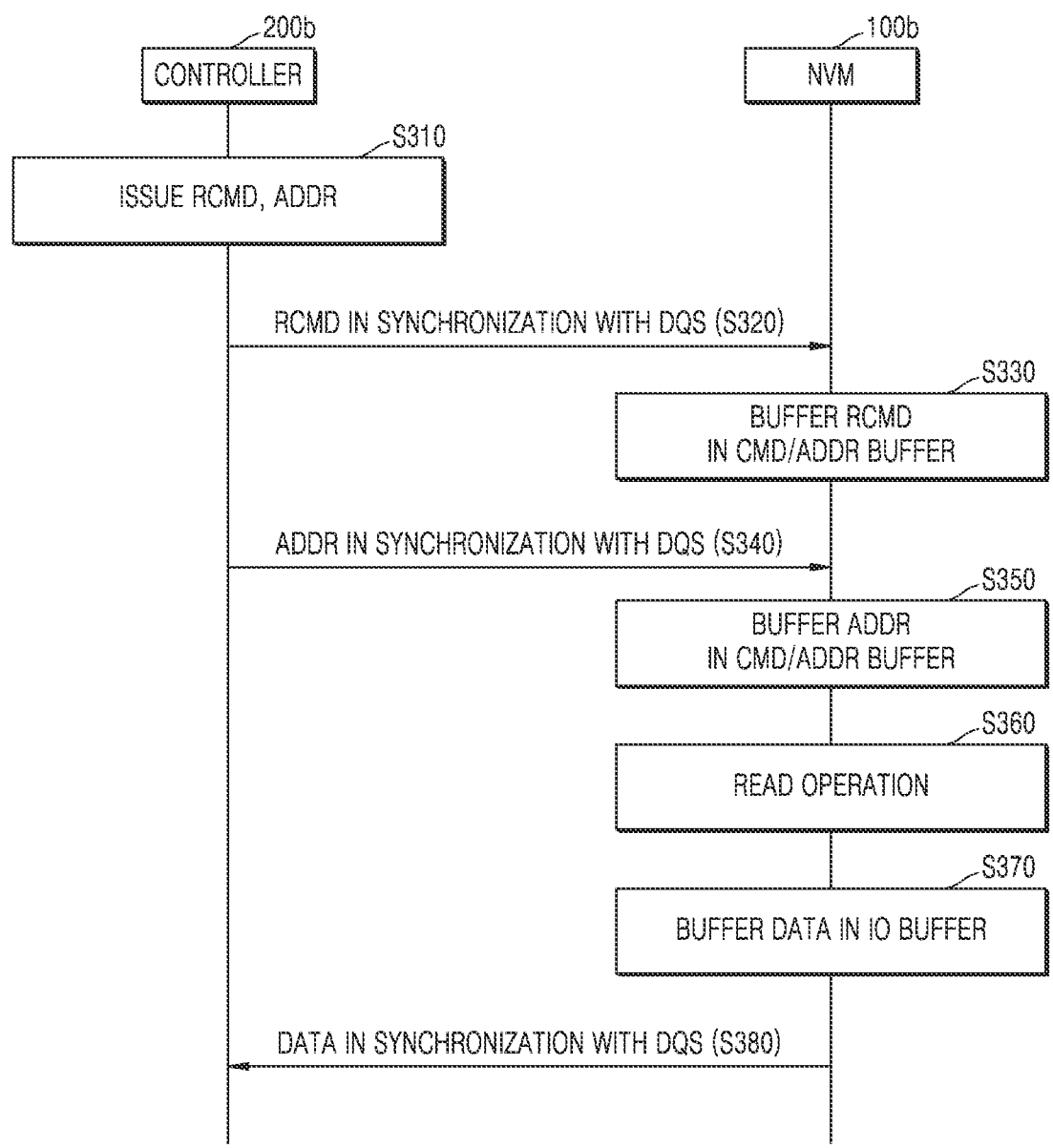
FIG. 11 is a flowchart illustrating a read operation between the controller and the non-volatile memory device of FIG. 6 according to an example embodiment.

FIG. 11 is a flowchart illustrating the read operation between the controller 200b and the non-volatile memory device 100b of FIG. 6 according to an example embodiment.

Referring to FIGS. 6, 10, and 11 together, the read operation according to the present embodiment may correspond to an implementation example of the operation illustrated in FIG. 3, and a redundant description will be omitted. In step S310, the controller 200b may issue a read command RCMD and the address ADDR. In step S320, the controller 200b may transmit the read command RCMD to the non-volatile memory device 100b in synchronization with the data strobe signal DQS. For example, the controller 200b may output the read command RCMD through the input/output pin P21 and may output the data strobe signal DQS that toggles through the data strobe signal pin P22', and the command CMD may be output in synchronization with the data strobe signal DQS. For example, the non-volatile memory device 100b may receive the read command RCMD through the input/output pin P11, may receive the data strobe signal DQS that toggles through the data strobe signal pin P12', and may receive the read command RCMD in synchronization with the data strobe signal DQS. At this time, the controller 200b may also transmit the activated command latch enable signal CLE to the non-volatile memory device 100b. In step S330, the non-volatile memory device 100b may buffer the read command RCMD in the command/address buffer 120.

In step S340, the controller 200b may transmit the address ADDR to the non-volatile memory device 100b in synchronization with the data strobe signal DQS. For example, the controller 200b may output the address ADDR through the input/output pin P21 and may output the data strobe signal DQS that toggles through the data strobe signal pin P22', and may output the address ADDR in synchronization with the data strobe signal DQS. For example, the non-volatile memory device 100b may receive the address ADDR through the input/output pin P11, may receive the data strobe signal DQS that toggles through a data strobe signal pin P12', and may receive the address ADDR in synchronization with the data strobe signal DQS. At this time, the controller 200b may also transmit the activated address latch enable signal ALE to the non-volatile memory device 100b. In step S350, the non-volatile memory device 100b may buffer the address ADDR in the command/address buffer 120.

In step S360, the non-volatile memory device 100b may perform the read operation. In detail, the non-volatile memory device 100b may read data from the memory cell array 110. In step S370, the non-volatile memory device 100b may buffer the read data DATA in the input/output buffer 140. In step S380, the non-volatile memory device 100b may transmit the data DATA to the controller 200b in synchronization with the data strobe signal DQS.

Figure 12:
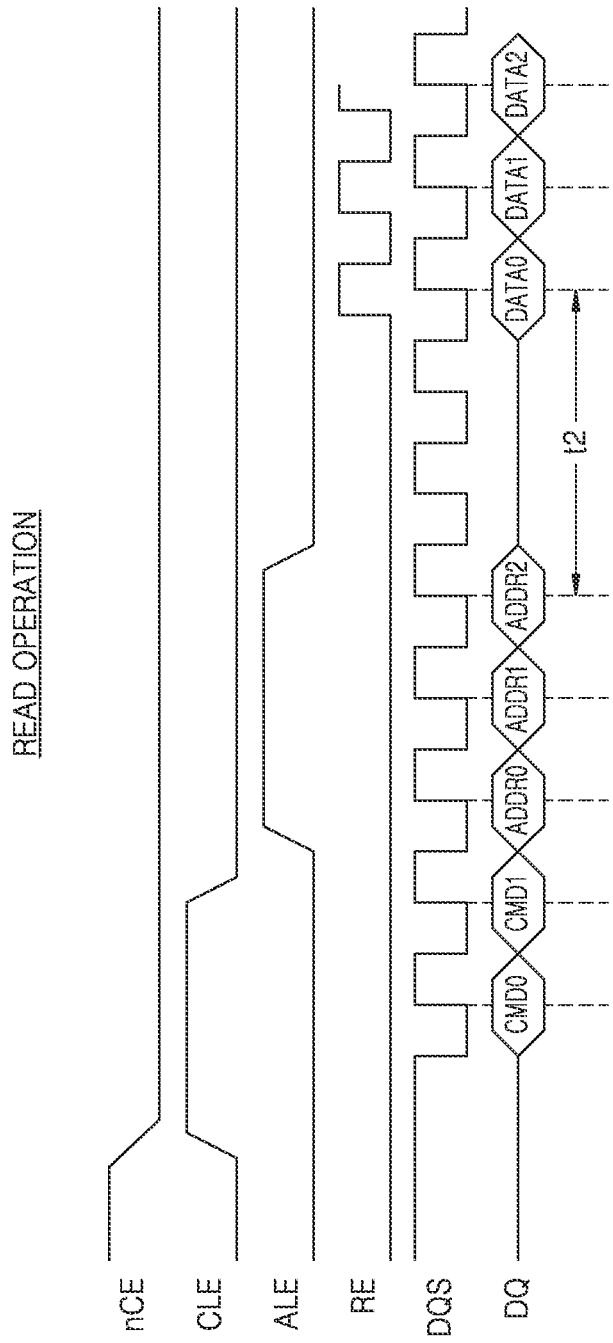
FIG. 12 is a timing diagram illustrating another example of signals in the read operation to the non-volatile memory device of FIG. 6 according to an example embodiment.

FIG. 12 is a timing diagram illustrating another example of signals in a read operation on the non-volatile memory device 100b of FIG. 6 according to an example embodiment.

Referring to FIG. 12, the read operation according to the present embodiment may correspond to a modification of the read operation illustrated in FIG. 10. According to the present embodiment, timing parameters related to the command and the address in the read operation may be determined as a multiple of the number of clock cycles of the data strobe signal DQS. For example, as illustrated in FIG. 12, there are three clock cycles between the address ADDR2 and the data DATA0. In this regard, a timing parameter t2 between the address ADDR2 and the data DATA0 may be determined as a value corresponding to three clock cycles of the data strobe signal DQS. Accordingly, as the toggling frequency of the data strobe signal DQS increases, the time between the address ADDR2 and the data DATA0 may decrease, and thus the input/output efficiency may be improved or maintained.

For example, the timing parameter t2 may be tWHR indicating a time from the address to a data output cycle. In the related art, the tWHR has been a fixed time value. Accordingly, although the data input/output speed between the controller 200b and the non-volatile memory device 100b is improved, the input/output efficiency has decreased due to the fixed time value of tWHR. However, according to example embodiments, the tWHR may be determined as a multiple of the number of clock cycles of the data strobe signal DQS. Accordingly, as the data input/output speed between the controller 200b and the non-volatile memory device 100b is improved, tWHR may be decreased. Therefore, the transmission times of the command and the address may be decreased according to the improvement of the data input/output speed, so that the input/output efficiency may be improved or maintained.

Figure 13:
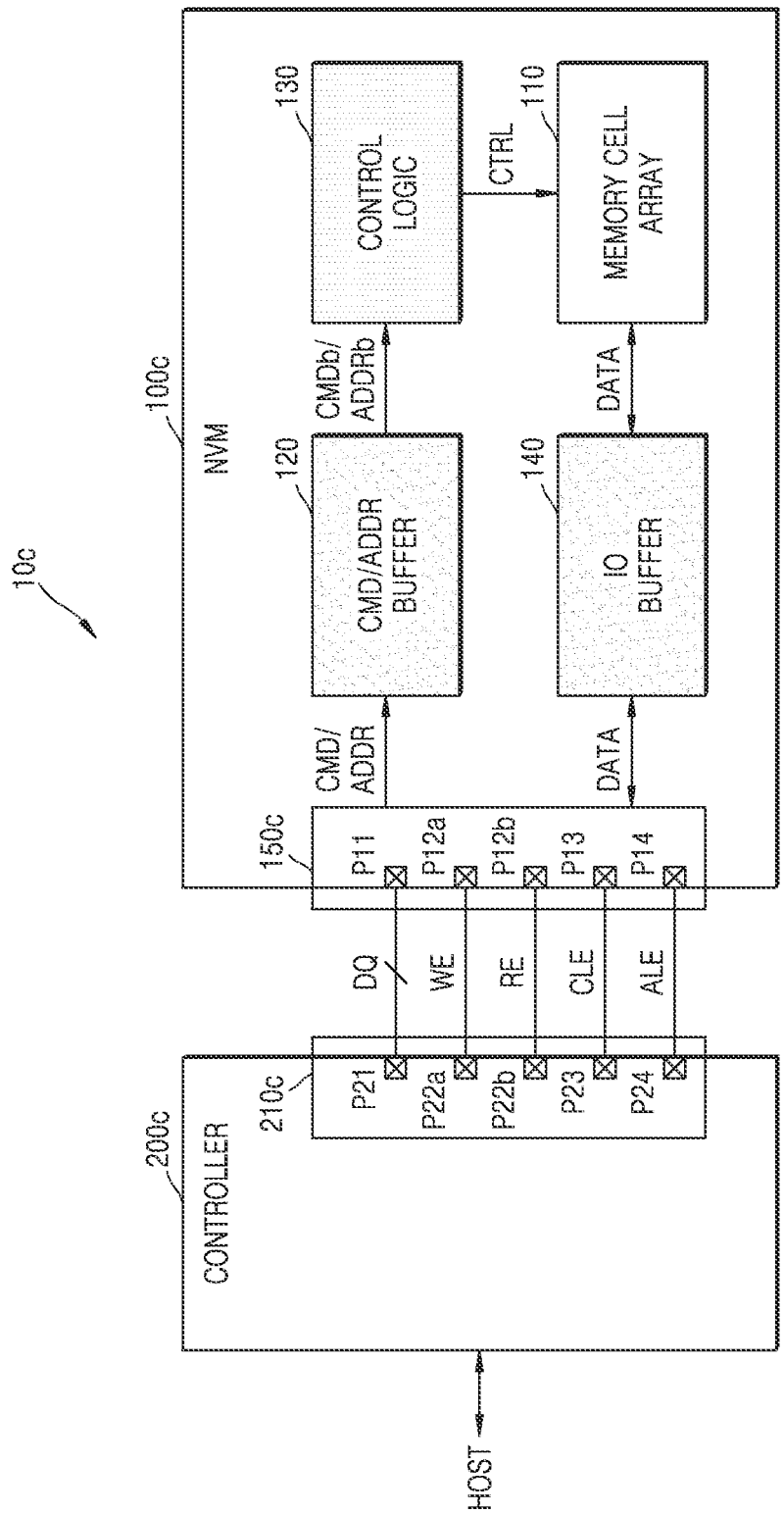
FIG. 13 is a block diagram illustrating a memory system according to an example embodiment.

FIG. 13 is a block diagram illustrating a memory system 10c according to an example embodiment.

Referring to FIG. 13, the memory system 10c may include a non-volatile memory device 100c and a controller 200c. The memory system 10b may correspond to one implementation embodiment of the memory system 10a of FIG. 4, the non-volatile memory device 100c may correspond to one implementation embodiment of the non-volatile memory device 100a of FIG. 4, and the controller 200c may correspond to one implementation embodiment of the controller 200a of FIG. 4. Accordingly, the descriptions given above with reference to FIGS. 1 to 4 may correspond to the memory system 10c.

The controller 200c may include an input/output interface 210c, and the input/output interface 210c may include the input/output pin P21, a write enable signal pin P22a, a read enable signal pin P22b, and the command latch enable signal pin P23 and the address latch enable signal pin P24. The write enable signal pin P22a and the read enable signal pin P22b may correspond to an example of the clock pin P22 of FIG. 1. The non-volatile memory device 100c may include an input/output interface 150c, and the input/output interface 150c may include the input/output pin P11, a write enable signal pin P12a, a read enable signal pin P12b, the command latch enable signal pin P13 and the address latch enable signal pin P14. The write enable signal pin P12a and the read enable signal pin P12b may correspond to an example of the clock pin P12 of FIG. 1.

Figure 14:
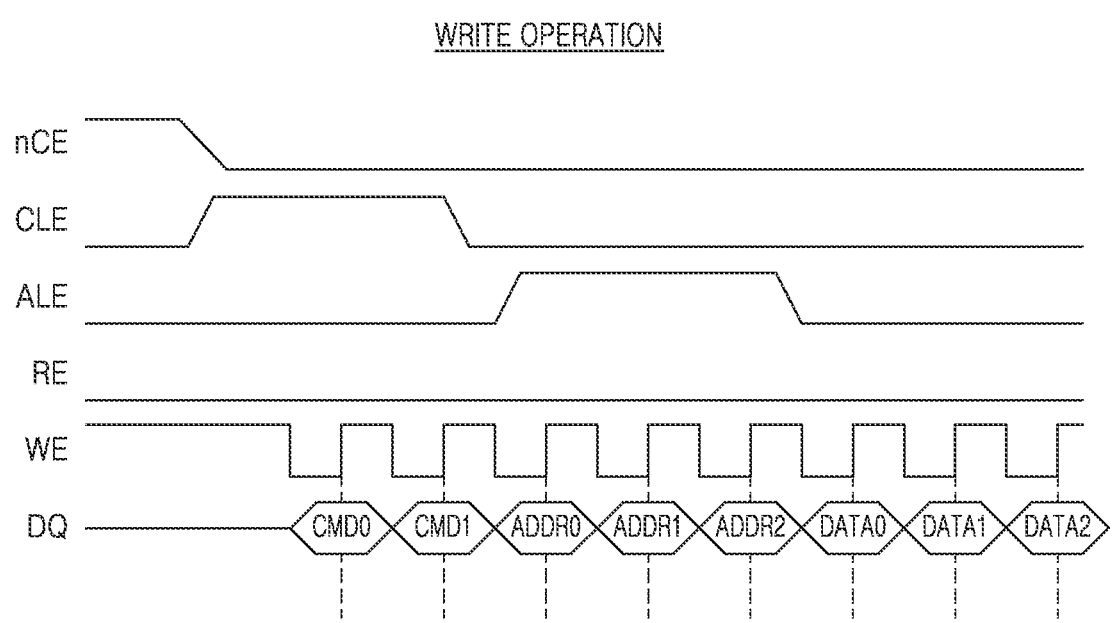
FIG. 14 is a timing diagram illustrating an example of signals in a write operation to the non-volatile memory device of FIG. 13 according to an example embodiment.

FIG. 14 is a timing diagram illustrating an example of signals in a write operation on the non-volatile memory device 100c of FIG. 13 according to an example embodiment.

Referring to FIGS. 13 and 14 together, the chip enable signal nCE may be enabled during the write operation on the non-volatile memory device 100c. The command latch enable signal CLE may be transmitted from the command latch enable signal pin P23 to the command latch enable signal pin P13 and may be enabled in the transmission period of commands CMD0 and CMD1. The address latch enable signal ALE may be transmitted from the address latch enable signal pin P24 to the address latch enable signal pin P14 and may be enabled in the transmission period of the addresses ADDR0 to ADDR2. The read enable signal RE may be disabled in the write operation.

A write enable signal WE may be transmitted from the write enable signal pin P22a to the write enable signal pin P12a and may be toggled at a fourth frequency. The data signal line DQ may be connected between the input/output pin P21 and the input/output pin P11, and the commands CMD0 and CMD1, the addresses ADDR0 to ADDR2 and the data DATA0 to DATA2 may be transmitted and received through the data signal line DQ in synchronization with the write enable signal WE.

The commands CMD0 and CMD1 may be sequentially transmitted from the input/output pin P21 to the input/output pin P11 in synchronization with the write enable signal WE. For example, the commands CMD0 and CMD1 may be synchronized to the rising edge of the write enable signal WE, and the commands CMD0 and CMD1 may correspond to a write command.

Subsequently, the addresses ADDR0 to ADDR2 may be sequentially transmitted from the input/output pin P21 to the input/output pin P11 in synchronization with the write enable signal WE. For example, the addresses ADDR0 to ADDR2 may be synchronized to the rising edge of the write enable signal WE, and the addresses ADDR0 to ADDR2 may correspond to a write address.

Subsequently, the data DATA0 to DATA2 may be sequentially transmitted from the input/output pin P21 to the input/output pin P11 in synchronization with the write enable signal WE. For example, the data DATA0 to DATA2 may be synchronized to the rising edge of the write enable signal WE, and the data DATA0 to DATA2 may correspond to data to be written to the memory cell array 110.

Figure 15:
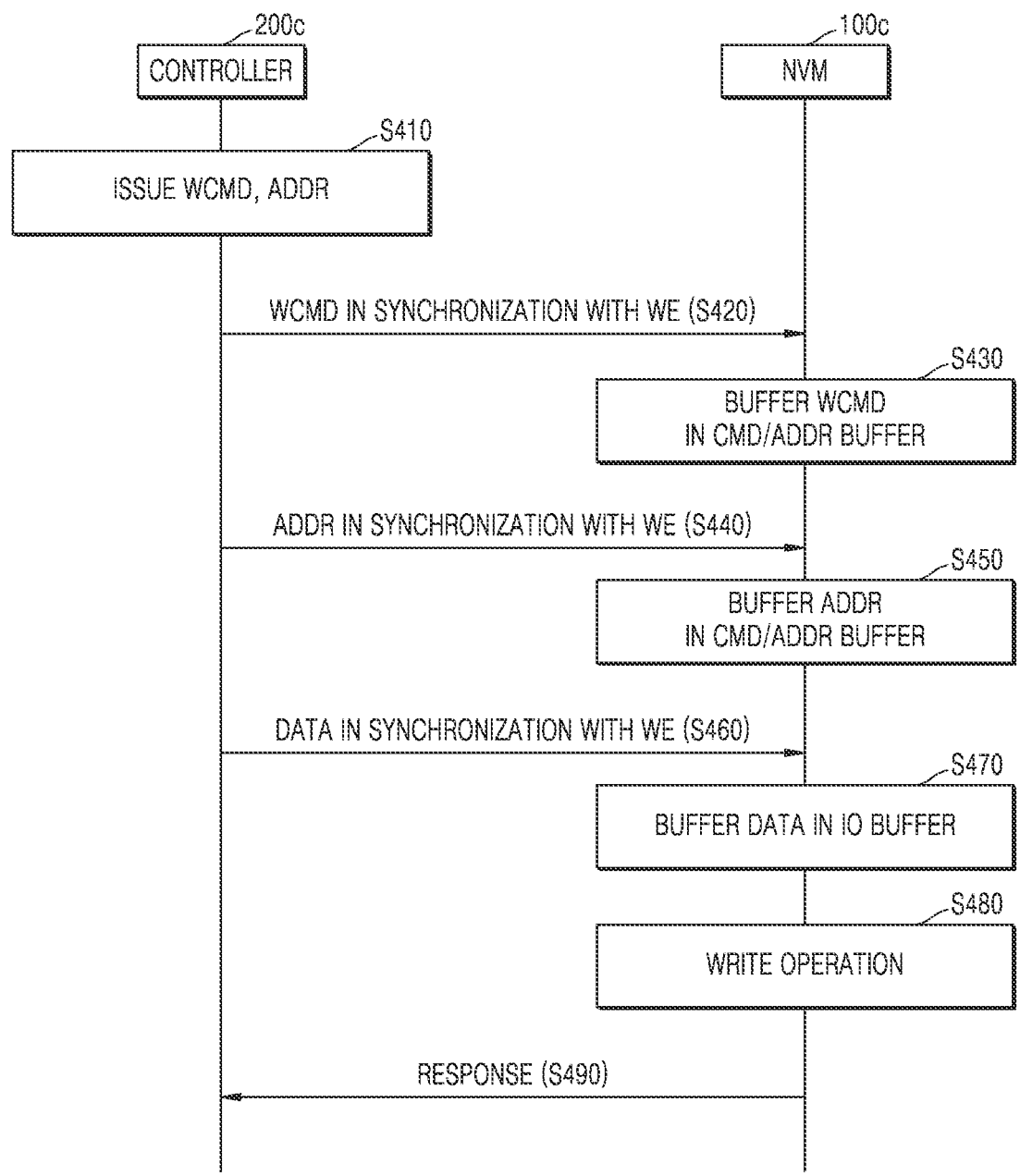
FIG. 15 is a flowchart illustrating the write operation between the controller and the non-volatile memory device of FIG. 13 according to an example embodiment.

FIG. 15 is a flowchart illustrating a write operation between the controller 200c and the non-volatile memory device 100c of FIG. 13 according to an example embodiment.

Referring to FIGS. 13 to 15 together, the write operation according to the present embodiment may correspond to an implementation example of the operation illustrated in FIG. 3, and a redundant description will be omitted. In step S410, the controller 200c may issue the write command WCMD and the address ADDR. In step S420, the controller 200c may transmit a write command WCMD to the non-volatile memory device 100c in synchronization with the write enable signal WE. For example, the controller 200c may output the write command WCMD through the input/output pin P21 and the write enable signal WE that toggles through the write enable signal pin P22a, and the command CMD may be output in synchronization with the write enable signal WE. For example, the non-volatile memory device 100c may receive the write command WCMD through the input/output pin P11 and the write enable signal WE that toggles through the write enable signal pin P12a, and the command CMD may be received in synchronization with the write enable signal WE. At this time, the controller 200c may also transmit the activated command latch enable signal CLE to the non-volatile memory device 100c. In step S430, the non-volatile memory device 100c may buffer the write command WCMD in the command/address buffer 120.

In step S440, the controller 200c may transmit the address ADDR to the non-volatile memory device 100c in synchronization with the write enable signal WE. For example, the controller 200c may output the address ADDR through the input/output pin P21 and output the write enable signal WE that toggles through the write enable signal pin P22a, and the address ADDR may be output in synchronization with the write enable signal WE. For example, the non-volatile memory device 100c may receive the address ADDR through the input/output pin P11 and the write enable signal WE that toggles through the write enable signal pin P12a, and the address ADDR may be received in synchronization with the write enable signal WE. At this time, the controller 200c may also transmit the activated address latch enable signal ALE to the non-volatile memory device 100c. In step S450, the non-volatile memory device 100c may buffer the address ADDR in the command/address buffer 120.

In step S460, the controller 200c may transmit the data DATA to the non-volatile memory device 100c in synchronization with the write enable signal WE. In step S470, the non-volatile memory device 100c may buffer the data DATA in the input/output buffer 140. In step S480, the non-volatile memory device 100c may perform the write operation. Specifically, the non-volatile memory device 100c may write the buffered data DATA in the memory cell array 110. In step S490, the non-volatile memory device 100c may transmit a response message indicating that the write operation is completed, to the controller 200c.

Figure 16:
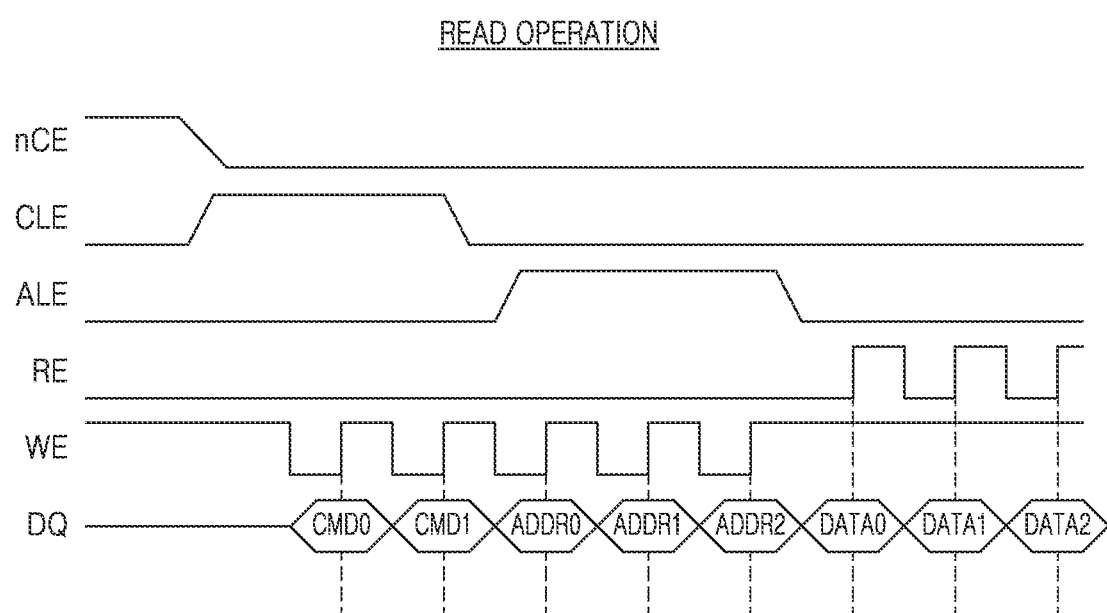
FIG. 16 is a timing diagram illustrating an example of signals in a read operation to the non-volatile memory device of FIG. 13 according to an example embodiment.

FIG. 16 is a timing diagram illustrating an example of signals in a read operation on the non-volatile memory device 100c of FIG. 13 according to an example embodiment.

Referring to FIGS. 13 and 16 together, the chip enable signal nCE may be enabled during the read operation on the non-volatile memory device 100c. The command latch enable signal CLE may be enabled in the transmission periods of the commands CMD0 and CMD1. The address latch enable signal ALE may be enabled in the transmission periods of the addresses ADDR0 to ADDR2.

The write enable signal WE may be toggled at the fourth frequency. In one embodiment, the write enable signal WE may be toggled in the transmission periods of the commands CMD0 and CMD1 and the addresses ADDR0 to ADDR2 at the fourth frequency, and then may not be toggled in the transmission periods of the data DATA0 to DATA2. The commands CMD0 and CMD1 may be sequentially transmitted in synchronization with the write enable signal WE. For example, the commands CMD0 and CMD1 may be synchronized to the rising edge of the write enable signal WE, and the commands CMD0 and CMD1 may correspond to a read command. The addresses ADDR0 to ADDR2 may be sequentially transmitted in synchronization with the write enable signal WE. For example, the addresses ADDR0 to ADDR2 may be synchronized to the rising edge of the write enable signal WE, and the addresses ADDR0 to ADDR2 may correspond to a read address.

The read enable signal RE may be toggled at a third frequency. According to one embodiment, the read enable signal RE may be toggled at the third frequency in periods in which the data DATA0 to DATA2 are transmitted through the data signal line DQ. The data DATA0 to DATA2 may be sequentially transmitted from the input/output pin P11 to the input/output pin P21 in synchronization with the read enable signal RE. For example, the data DATA0 to DATA2 may be synchronized to the rising edge of the read enable signal RE, and the data DATA0 to DATA2 may correspond to data read from the memory cell array 110.

Figure 17:
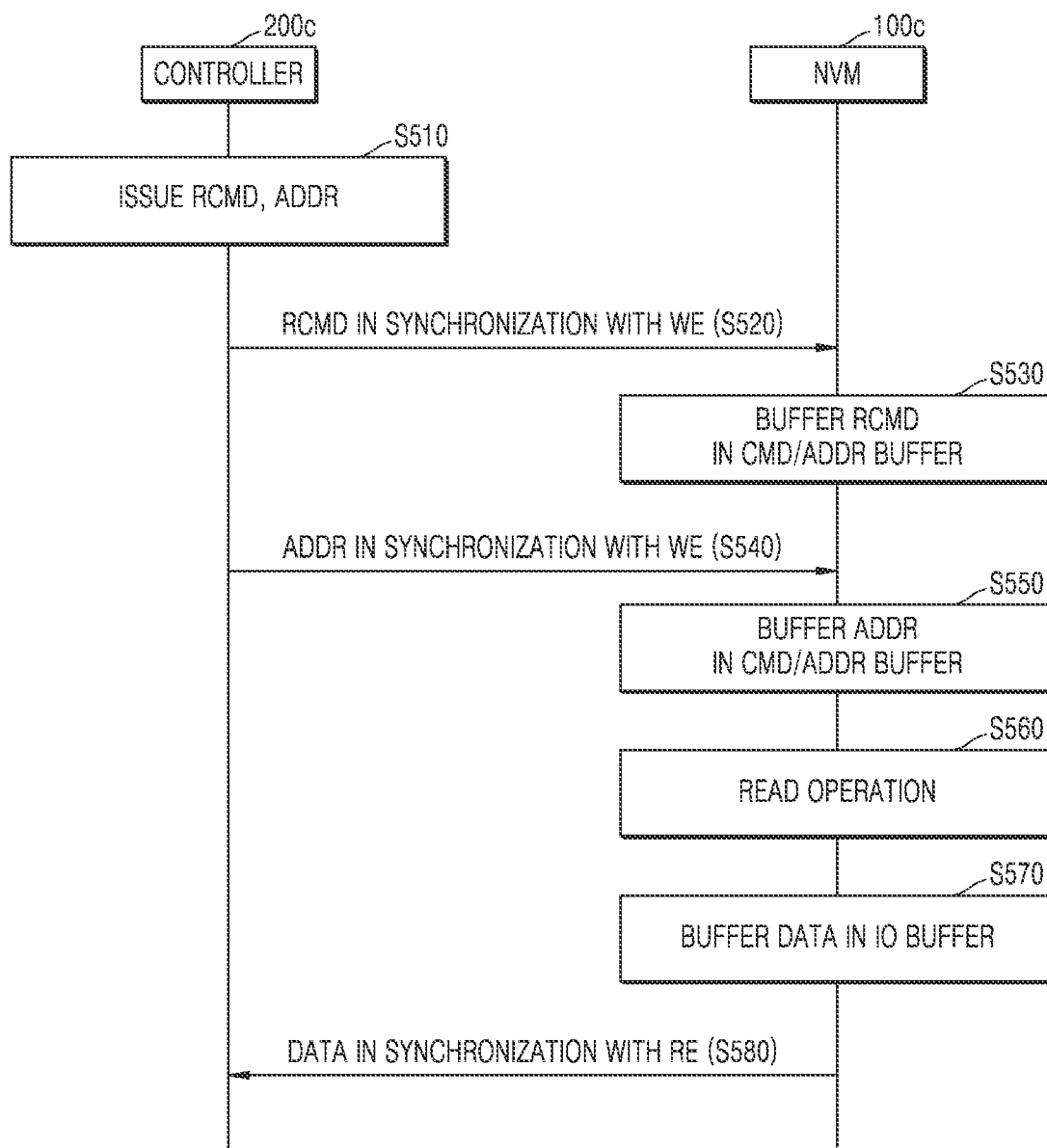
FIG. 17 is a flowchart illustrating the read operation between the controller and the non-volatile memory device of FIG. 13 according to an example embodiment.

FIG. 17 is a flowchart illustrating a read operation between the controller 200c and the non-volatile memory device 100c of FIG. 13 according to an example embodiment.

Referring to FIGS. 13, 16 and 17 together, the read operation according to the present embodiment may correspond to an implementation example of the operation illustrated in FIG. 3, and a redundant description will be omitted. In step S510, the controller 200c may issue the read command RCMD and the address ADDR. In step S520, the controller 200c may transmit the read command RCMD to the non-volatile memory device 100c in synchronization with the write enable signal WE. For example, the controller 200c may output the read command RCMD through the input/output pin P21 and the write enable signal WE that toggles through the write enable signal pin P22a, and the command CMD may be output in synchronization with the write enable signal WE. For example, the non-volatile memory device 100c may receive the read command RCMD through the input/output pin P11 and the write enable signal WE that toggles through the write enable signal pin P12a, and the command CMD may be received in synchronization with the write enable signal WE. At this time, the controller 200c may also transmit the activated command latch enable signal CLE to the non-volatile memory device 100c. In step S530, the non-volatile memory device 100c may buffer the read command RCMD in the command/address buffer 120.

In step S540, the controller 200c may transmit the address ADDR to the non-volatile memory device 100c in synchronization with the write enable signal WE. For example, the controller 200c may output the address ADDR through the input/output pin P21 and output the write enable signal WE that toggles through the write enable signal pin P22a, and the address ADDR may be output in synchronization with the write enable signal WE. For example, the non-volatile memory device 100c may receive the address ADDR through the input/output pin P11 and the write enable signal WE that toggles through the write enable signal pin P12a, and the address ADDR may be received in synchronization with the write enable signal WE. At this time, the controller 200c may also transmit the activated address latch enable signal ALE to the non-volatile memory device 100c. In step S550, the non-volatile memory device 100c may buffer the address ADDR in the command/address buffer 120.

In step S560, the non-volatile memory device 100c may perform the read operation. In detail, the non-volatile memory device 100c may read data from the memory cell array 110. In step S570, the non-volatile memory device 100c may buffer the read data DATA in an input/output buffer 140. In step S580, the non-volatile memory device 100c may transmit the data DATA to the controller 200c in synchronization with the read enable signal RE.

Figure 18:
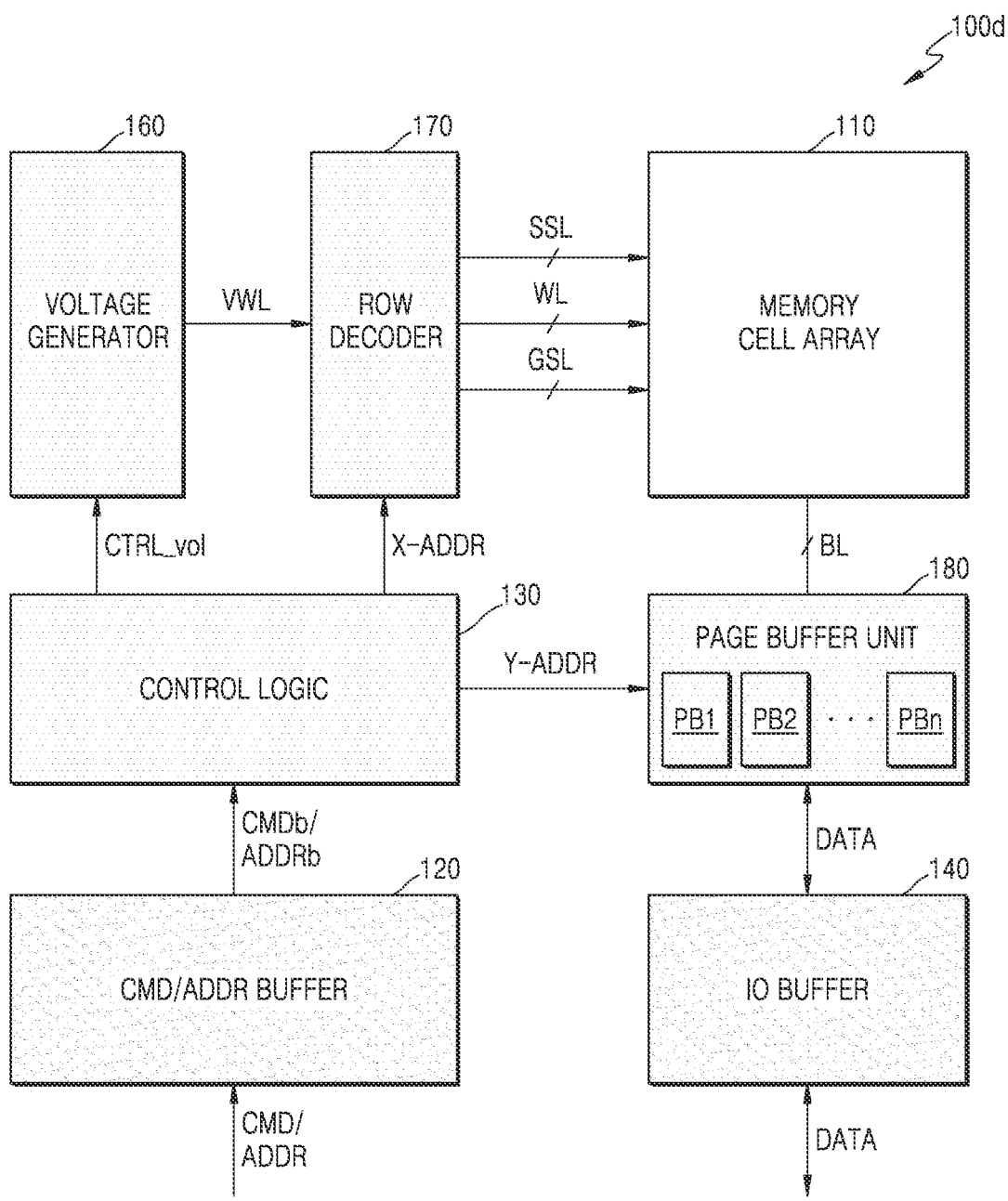
FIG. 18 is a block diagram illustrating a non-volatile memory device according to an example embodiment.

FIG. 18 is a block diagram illustrating in more detail a non-volatile memory device 100d according to an example embodiment.

Referring to FIG. 18, the non-volatile memory device 100d may include the memory cell array 110, the command/address buffer 120, the control logic 130, the input/output buffer 140, a voltage generator 160, a row decoder 170, and a page buffer unit 180. The non-volatile memory device 100d according to the present embodiment may correspond to one implementation embodiment of the non-volatile memory device 100 of FIG. 1, and the above description described with reference to FIGS. 1 to 17 may correspond to the non-volatile memory device 100d.

The command/address buffer 120 and the input/output buffer 140 may operate at a first operating speed corresponding to the data input/output speed, and the control logic 130, the voltage generator 160, the row decoder 170, and the page buffer unit 180 may operate at a second operating speed corresponding to an internal operating speed of the non-volatile memory device 100d. According to one or more example embodiments, the non-volatile memory device 100d may further include a pre-decoder, a temperature sensor, a command decoder, an address decoder, and the like, and they may operate at a second operating speed.

The memory cell array 110 may be connected to the page buffer unit 180 through bit lines BL, and may be connected to the row decoder 170 through word lines WL, string select lines SSL, and ground select lines GSL. The memory cell array 110 may include a plurality of memory cells, for example, the plurality of memory cells may include NAND flash memory cells. However, example embodiments are not limited thereto, and in some example embodiments, the plurality of memory cells may include resistive memory cells such as resistive RAM (ReRAM), phase change RAM (PRAM), or magnetic RAM (MRAM).

In one embodiment, the memory cell array 110 may include a three dimensional memory cell array, wherein the three dimensional memory cell array may include a plurality of NAND strings, and each NAND string may include memory cells respectively connected to the word lines stacked vertically on a substrate. U.S. Pat. Nos. 7,679,133, 8,553,466, 8,654,587, 8,559,235, and US Patent Application Publication No. 2011/0233648 are incorporated herein by reference. In some embodiments, the memory cell array 110 may include a two-dimensional memory cell array, and the two-dimensional memory cell array may include a plurality of NAND strings disposed along row and column directions.

The page buffer unit 180 may include a plurality of page buffers PB1 to PBn (n is an integer of 2 or more), and the plurality of page buffers PB1 to PBn may be respectively connected to the memory cells through the plurality of bit lines BL. The page buffer unit 180 may select some bit lines among the bit lines BL based on a column address Y-ADDR. In detail, the page buffer unit 180 may operate as a write driver or a sense amplifier according to an operation mode.

The control logic 130 may output various control signals, for example, a voltage control signal CTRL_vol, a row address X-ADDR, and the column address Y-ADDR, in order to program data in the memory cell array 110, to read data from the memory cell array 110, or to erase data stored in the memory cell array 110, based on the buffered command CMDb and the buffered address ADDRb. Accordingly, the control logic 130 may control various operations in the non-volatile memory device 100d as a whole.

The voltage generator 160 may generate various voltages for performing program, read, and erase operations on the memory cell array 110, based on the voltage control signal CTRL_vol. In detail, the voltage generator 160 may generate a word line voltage VWL, for example, a program voltage, a read voltage, a program verify voltage, and the like. The row decoder 170 may select one of the plurality of word lines WL and may select one of the string selection lines SSL based on the row address X-ADDR.

Figure 19:
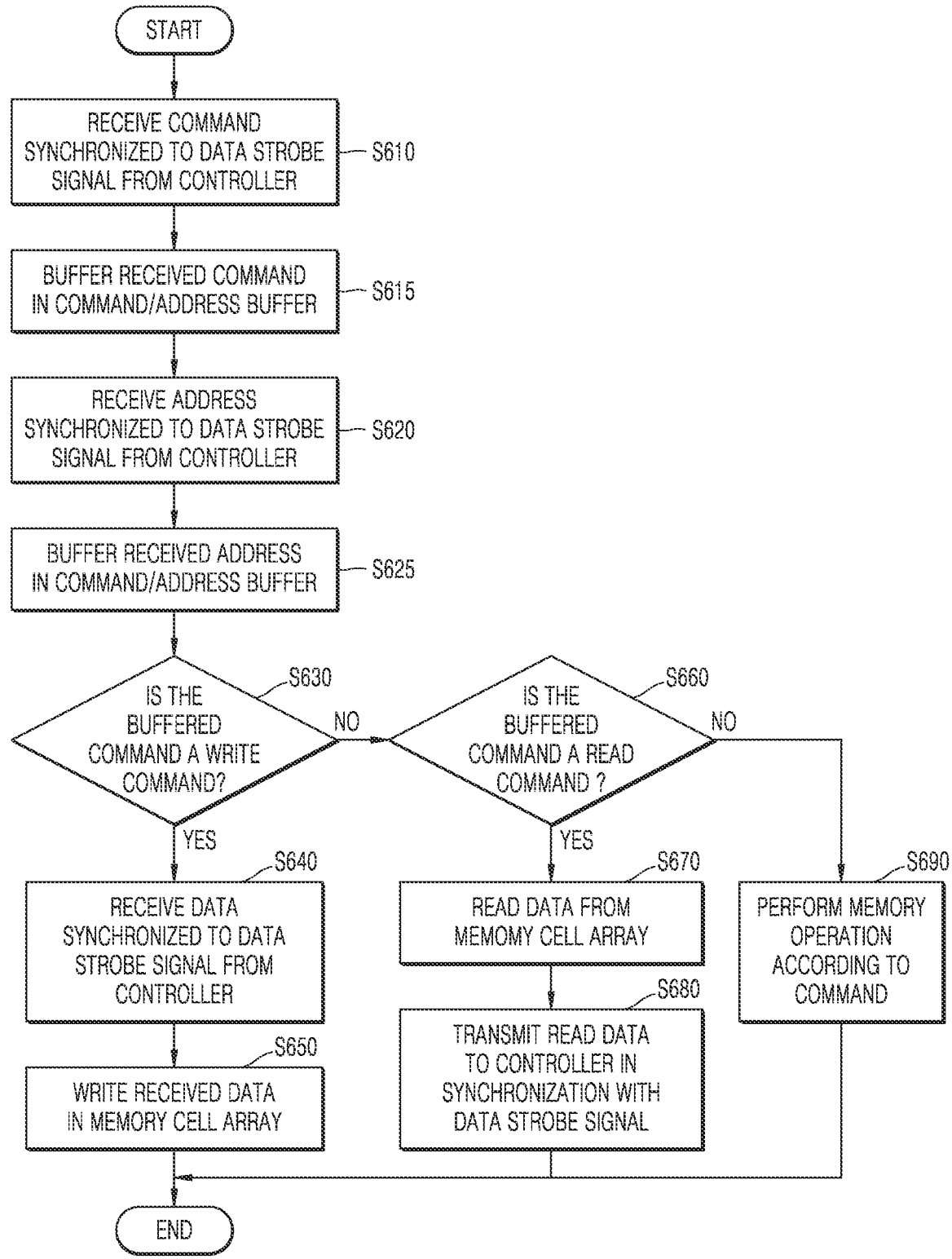
FIG. 19 is a flowchart illustrating a method of operating a non-volatile memory device according to an example embodiment.

FIG. 19 is a flowchart illustrating a method of operating a non-volatile memory device according to an example embodiment.

Referring to FIG. 19, the method of operating the non-volatile memory device according to the present embodiment may include, for example, steps that are sequentially performed in the non-volatile memory device 100d of FIG. 18. Hereinafter, a description will be described with reference to FIGS. 6, 18, and 19 together. In step S610, the non-volatile memory device 100d may receive the command CMD synchronized to the data strobe signal DQS from the controller 200b. However, example embodiments are not limited to the data strobe signal DQS, and the non-volatile memory device 100d may receive a command CMD synchronized with a clock signal provided from the controller 200b.

In step S615, the non-volatile memory device 100d may buffer the received command CMD in the command/address buffer 120. In step S620, the non-volatile memory device 100d may receive the address ADDR synchronized with the data strobe signal DQS from the controller 200b. However, example embodiments are not limited to the data strobe signal DQS, and the non-volatile memory device 100*d* may receive the address ADDR synchronized with a clock signal provided from the controller 200*b*. In step S625, the non-volatile memory device 100*d* may buffer the received address ADDR in the command/address buffer 120.

In step S630, the non-volatile memory device 100*d* may determine whether the buffered command CMDb is a write command. If it is determined that the buffered command CMDb is the write command, step S640 may be performed, otherwise, step S660 may be performed. In step S640, the non-volatile memory device 100*d* may receive the data DATA synchronized to the data strobe signal DQS from the controller 200*b*. In step S650, the non-volatile memory device 100*d* may write the received data DATA in the memory cell array 110.

In step S660, the non-volatile memory device 100*d* may determine whether the buffered command CMDb is a read command. If it is determined that the buffered command CMDb is the read command, step S670 may be performed, otherwise, step S690 may be performed. In step S670, the non-volatile memory device 100*d* may read the data DATA from the memory cell array 110. In step S680, the non-volatile memory device 100*d* may transmit the read data to the controller 200*b* in synchronization with the data strobe signal DQS. In step S690, the non-volatile memory device 100*d* may perform a memory operation according to a command. For example, the command may be an erase command, and the non-volatile memory device 100*d* may perform the erase operation on a memory block corresponding to an erase address based on the erase command.

Figure 20:
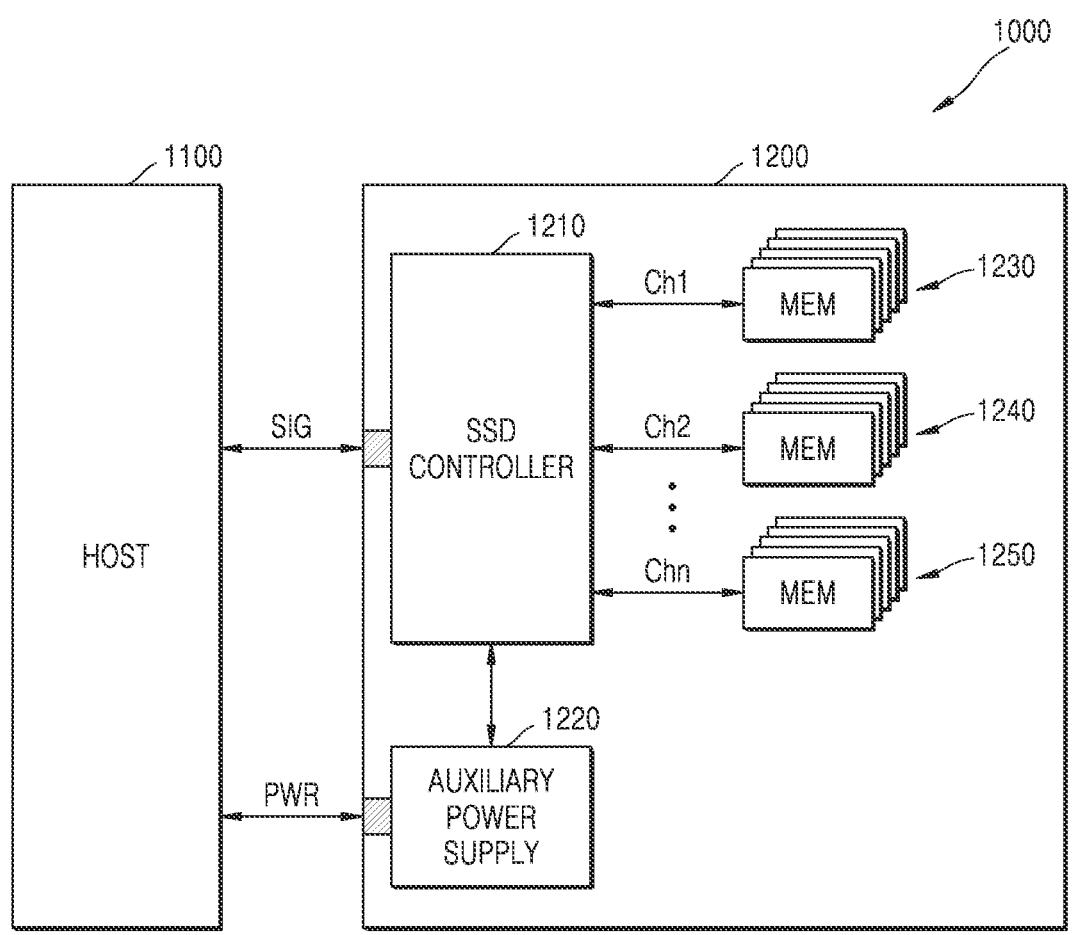
FIG. 20 is a block diagram illustrating an example in which a memory device according to example embodiments is applied to an SSD system.

FIG. 20 is a block diagram illustrating a memory device applied to an SSD system 1000 according to one or more example embodiments.

Referring to FIG. 20, the SSD system 1000 may include a host 1100 and an SSD 1200. The SSD 1200 may exchange a signal SIG with the host 1100 through a signal connector and receive a power PWR through a power connector. The SSD 1200 may include an SSD controller 1210, an auxiliary power supply 1220, and memory devices 1230, 1240, and 1250. The memory devices 1230, 1240, and 1250 may be respectively connected to the SSD controller 1210 through channels Ch1, Ch2, and Chn.

The SSD controller 1210 may be implemented by using the controllers 200, 200*a*, 200*b*, and 200*c* described above with reference to FIGS. 1 to 19. In detail, the SSD controller 1210 may output the command and the address through the same input/output channel as that of the data, and synchronize the command and the address with a data input/output clock signal to transmit the same to the memory devices 1230, 1240, and 1250.

The memory devices 1230, 1240, and 1250 may be implemented by using the non-volatile memory devices 100, 100*a*, 100*b*, 100*c*, and 100*d* described above with reference to FIGS. 1 to 19. In detail, each of the memory devices 1230, 1240, and 1250 may receive the command and the address from the SSD controller 1210 through the same input/output channel as that of the data, and receive the command and the address from the SSD controller 1210 in synchronization with a clock signal such as a data input/output clock signal.

While example embodiments have been illustrated and described above, it will be apparent to those skilled in the art that modifications and variations may be made without departing from the spirit and scope of the following claims.

What is claimed is:

1. A non-volatile memory device comprising:
a first clock pin, a first clock signal being received from a controller through the first clock pin;
a second clock pin, a second clock signal being received from the controller through the second clock pin;
a first input/output pin, a command and an address being received from the controller in synchronization with the first clock signal through the first input/output pin;
a second input/output pin, data being received from the controller in synchronization with the second clock signal through the second input/output pin;
a command/address buffer configured to buffer the command and the address received through the first input/output pin, and to operate at a first operating speed;
a memory cell array comprising a plurality of memory cells; and
a control logic configured to control, at a second operating speed different from the first operating speed, operations with respect to the plurality of memory cells based on the command and the address buffered in the command/address buffer.

2. The non-volatile memory device of claim 1, wherein the first clock signal corresponds to a write enable signal.

3. The non-volatile memory device of claim 1, wherein the second clock signal corresponds to a read enable signal.

4. The non-volatile memory device of claim 1, wherein the second clock signal corresponds to a data strobe signal.

5. The non-volatile memory device of claim 1, wherein the first operating speed corresponds to a data input/output speed between the non-volatile memory device and the controller.

6. The non-volatile memory device of claim 1, wherein the second operating speed is less than the first operating speed.

7. The non-volatile memory device of claim 1, further comprising:
an input/output buffer configured to operate at the first operating speed and buffer the data received through the second input/output pin.

8. The non-volatile memory device of claim 7, wherein the buffered data in the input/output buffer is processed at an internal operating speed of the non-volatile memory device.

9. The non-volatile memory device of claim 1, wherein the first clock signal is configured to toggle only in a period in which the command and the address are received from the controller.

10. The non-volatile memory device of claim 1, wherein the second clock signal is configured to toggle only in a period in which the data is received from the controller.

11. A controller comprising:
a first clock pin, a second clock pin, a first input/output pin and a second input/output pin that are configured to connect to a non-volatile memory device; and
at least one processor configured to:
transmit a first clock signal to the non-volatile memory device through the first clock pin;
transmit a second clock signal to the non-volatile memory device through the second clock pin;
transmit a command and an address in synchronization with the first clock signal to the non-volatile memory device through the first input/output pin; and
transceive data synchronized with the second clock signal with the non-volatile memory device through the second input/output pin,
wherein the first clock signal is configured to toggle only in a period in which the command and the address are transmitted to the non-volatile memory device.

12. The controller of claim 11, wherein the first clock signal corresponds to a write enable signal.

13. The controller of claim 11, wherein the second clock signal corresponds to a read enable signal.

14. The controller of claim 11, wherein the second clock signal corresponds to a data strobe signal and the second clock pin corresponds to a data strobe signal pin.

15. A memory system comprising:
a non-volatile memory device; and
a controller configured to transmit a first clock signal, a second clock signal, a command, an address and data, to the non-volatile memory device;
wherein the non-volatile memory device comprises:
a first clock pin, the first clock signal being received from the controller through the first clock pin;
a second clock pin, the second clock signal being received from the controller through the second clock pin;
a first input/output pin, the command and the address being received from the controller in synchronization with the first clock signal through the first input/output pin;
a second input/output pin, the data being received from the controller in synchronization with the second clock signal through the second input/output pin;
a command/address buffer configured to buffer the command and the address received through the first input/output pin;
a memory cell array comprising a plurality of memory cells; and
a control logic configured to operate control operations with respect to the plurality of memory cells based on the command and the address buffered in the command/address buffer,
wherein the first clock signal is configured to toggle only in a period in which the command and the address are transmitted to the non-volatile memory device, and
wherein the second clock signal is configured to toggle in a period in which the data is transmitted to the non-volatile memory device.

16. The memory system of claim 15, wherein the first clock signal corresponds to a write enable signal.

17. The memory system of claim 15, wherein the second clock signal corresponds to a read enable signal.

18. The memory system of claim 15, wherein the second clock signal corresponds to a data strobe signal.

19. The memory system of claim 15, wherein the command/address buffer is further configured to operate at a first operating speed,
wherein the control logic is further configured to operate at a second operating speed that is different from the first operating speed, and
wherein the second operating speed is less than the first operating speed.

20. The controller of claim 11, wherein the second clock signal is configured to toggle in a period in which the data is transmitted to the non-volatile memory device.

* * * * *